United States Patent
Nishimura et al.

(10) Patent No.: US 7,528,460 B2
(45) Date of Patent: May 5, 2009

(54) SEMICONDUCTOR DEVICE SEALED WITH ELECTRICAL INSULATION SEALING MEMBER

(75) Inventors: Takao Nishimura, Kawasaki (JP); Tetsuya Hiraoka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 179 days.

(21) Appl. No.: 11/414,485

(22) Filed: May 1, 2006

(65) Prior Publication Data

US 2007/0170600 A1 Jul. 26, 2007

(30) Foreign Application Priority Data

Jan. 24, 2006 (JP) .............................. 2006-015610

(51) Int. Cl.
*H01L 29/00* (2006.01)
*H01L 23/495* (2006.01)
*H01L 23/02* (2006.01)

(52) U.S. Cl. ....................... 257/528; 257/536; 257/666; 257/678

(58) Field of Classification Search ......... 257/528–543, 257/666–678

See application file for complete search history.

(56) References Cited

U.S. PATENT DOCUMENTS

2005/0212107 A1* 9/2005 Kato .......................... 257/678

FOREIGN PATENT DOCUMENTS

| JP | 8-162607 | 6/1996 |
|----|----------|--------|
| JP | 2504486 | 6/1996 |
| JP | 11-54880 | 2/1999 |
| JP | 2004-22789 | 1/2004 |
| JP | 2004-47811 | 2/2004 |

* cited by examiner

*Primary Examiner*—Cuong Q Nguyen
(74) *Attorney, Agent, or Firm*—Fujitsu Patent Center

(57) ABSTRACT

A semiconductor device capable of preventing contact between electrode terminals and a die pad as well as capable of surely performing wire bonding to the electrode terminals. A passive component is formed such that a vertical height of each electrode terminal is higher than that of an element part. More specifically, each cross-sectional area of the electrode terminals is slightly larger than that of the element part. Therefore, an upper part and lower part of each electrode terminal are slightly higher than (project from) the element part. Through an adhesive, the passive component is fixed such that the element part is located on the high position part so as to be nearly parallel to a substrate surface. Further, a part of each electrode terminal (bottom part) is located in each space within concave parts. Thus, a predetermined space is formed between each of the electrode terminals and the die pad.

14 Claims, 27 Drawing Sheets

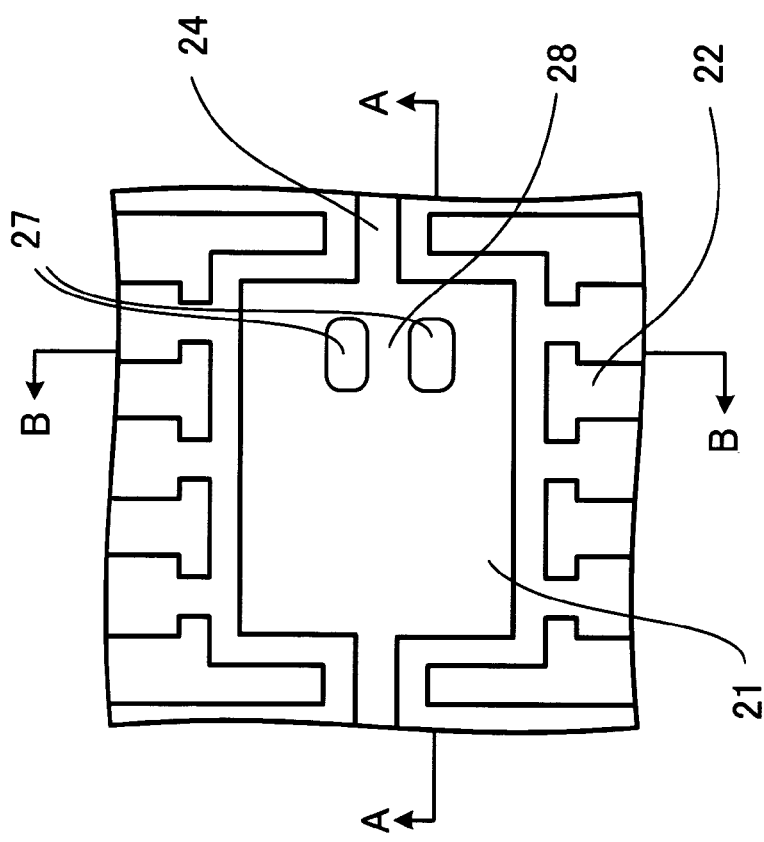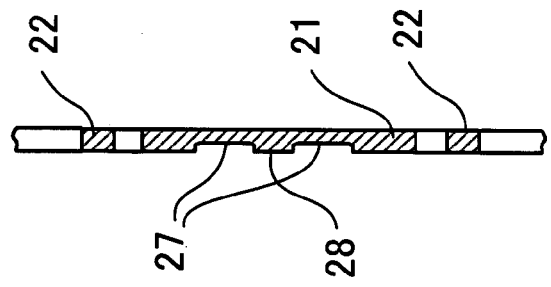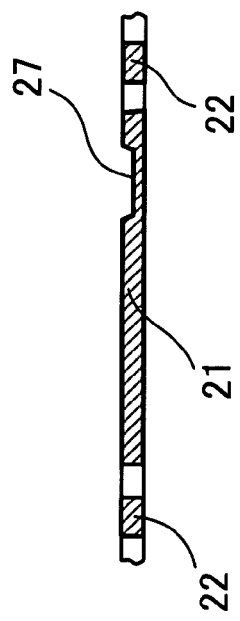
FIG. 4A
FIG. 4B
FIG. 4C

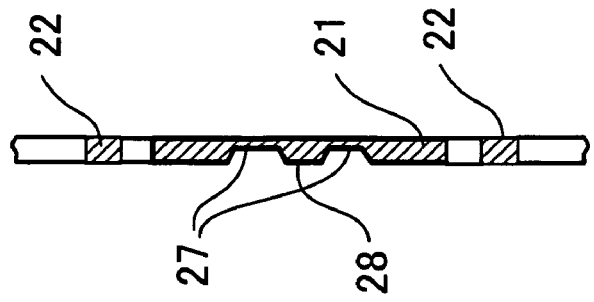
FIG. 7C
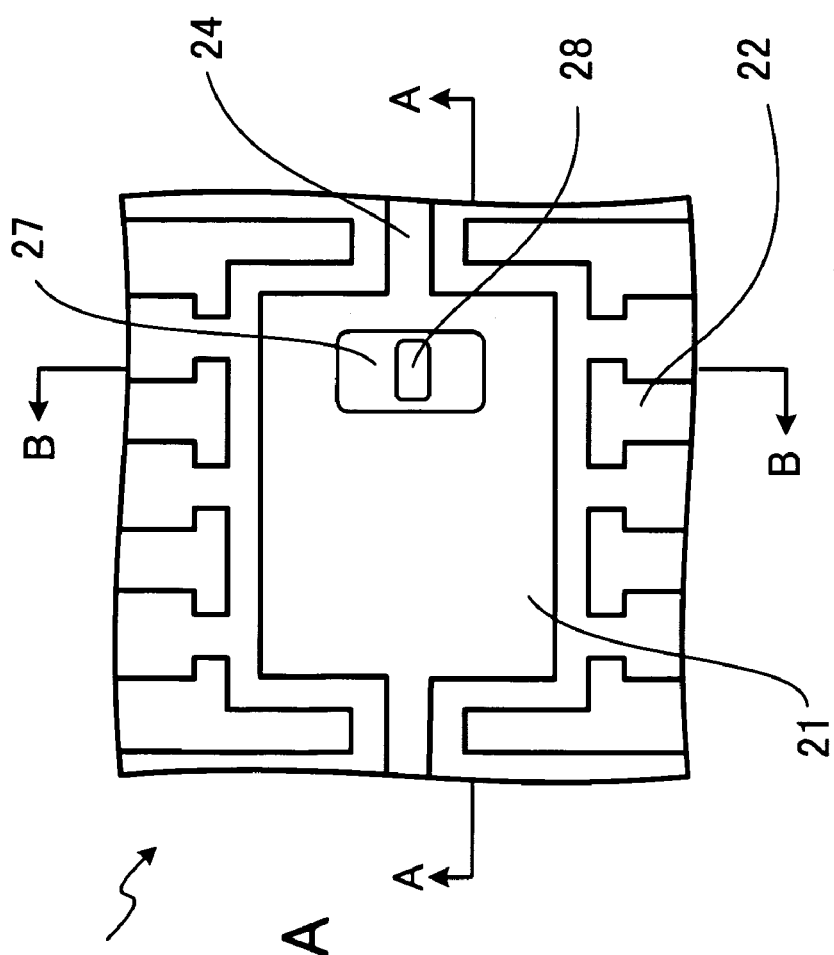
FIG. 7A
FIG. 7B

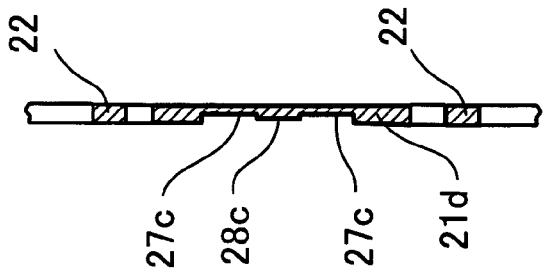
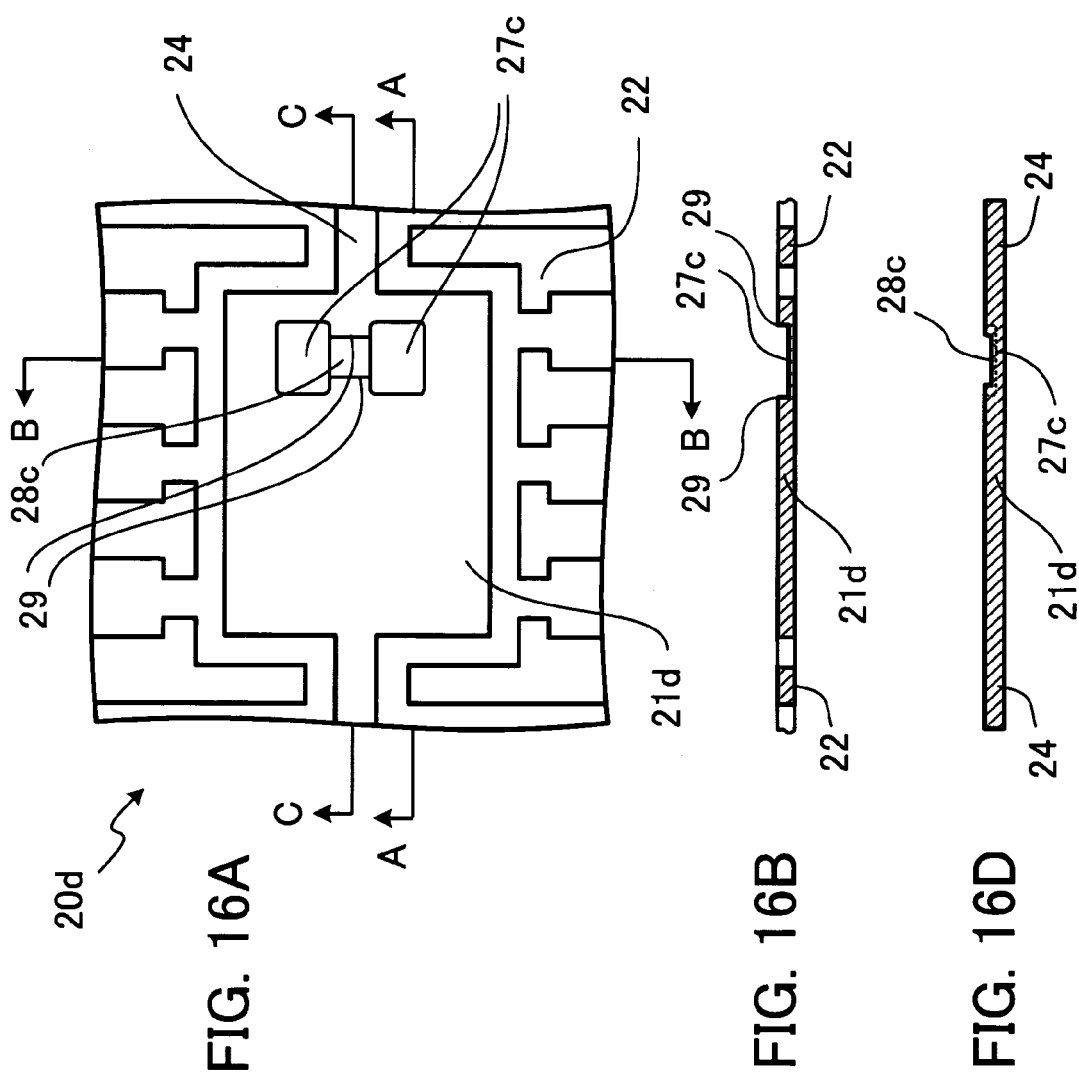
FIG. 16C
FIG. 16A
FIG. 16B
FIG. 16D

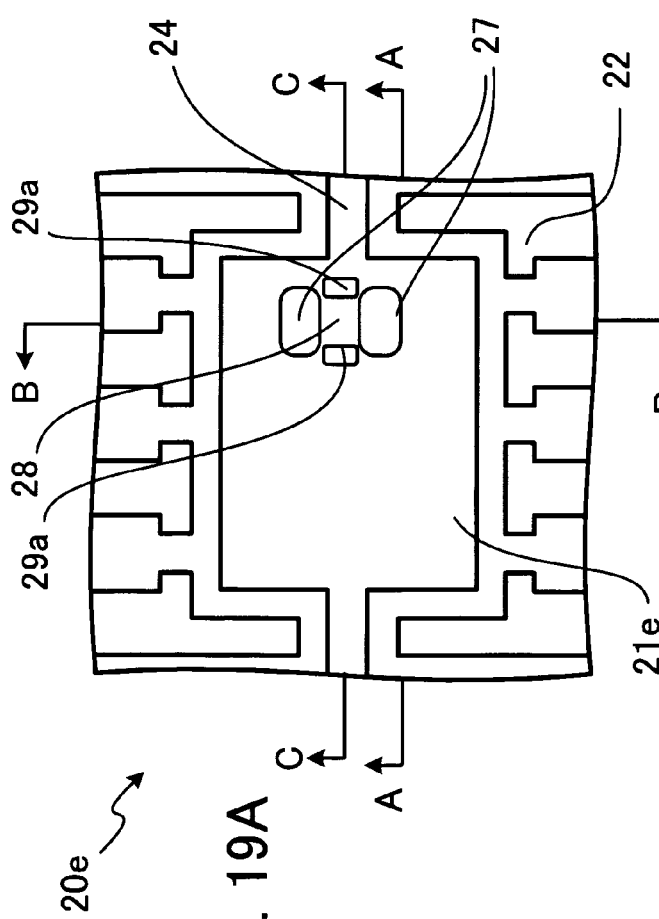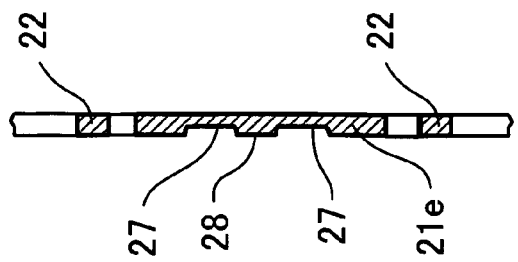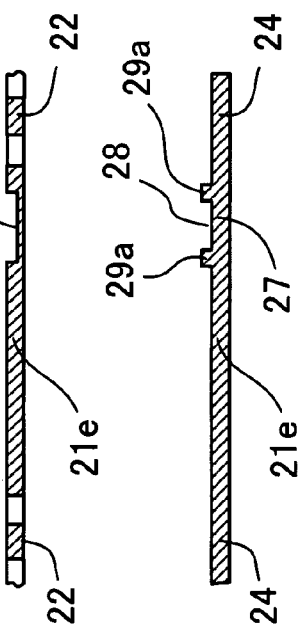
FIG. 19A
FIG. 19B
FIG. 19C
FIG. 19D

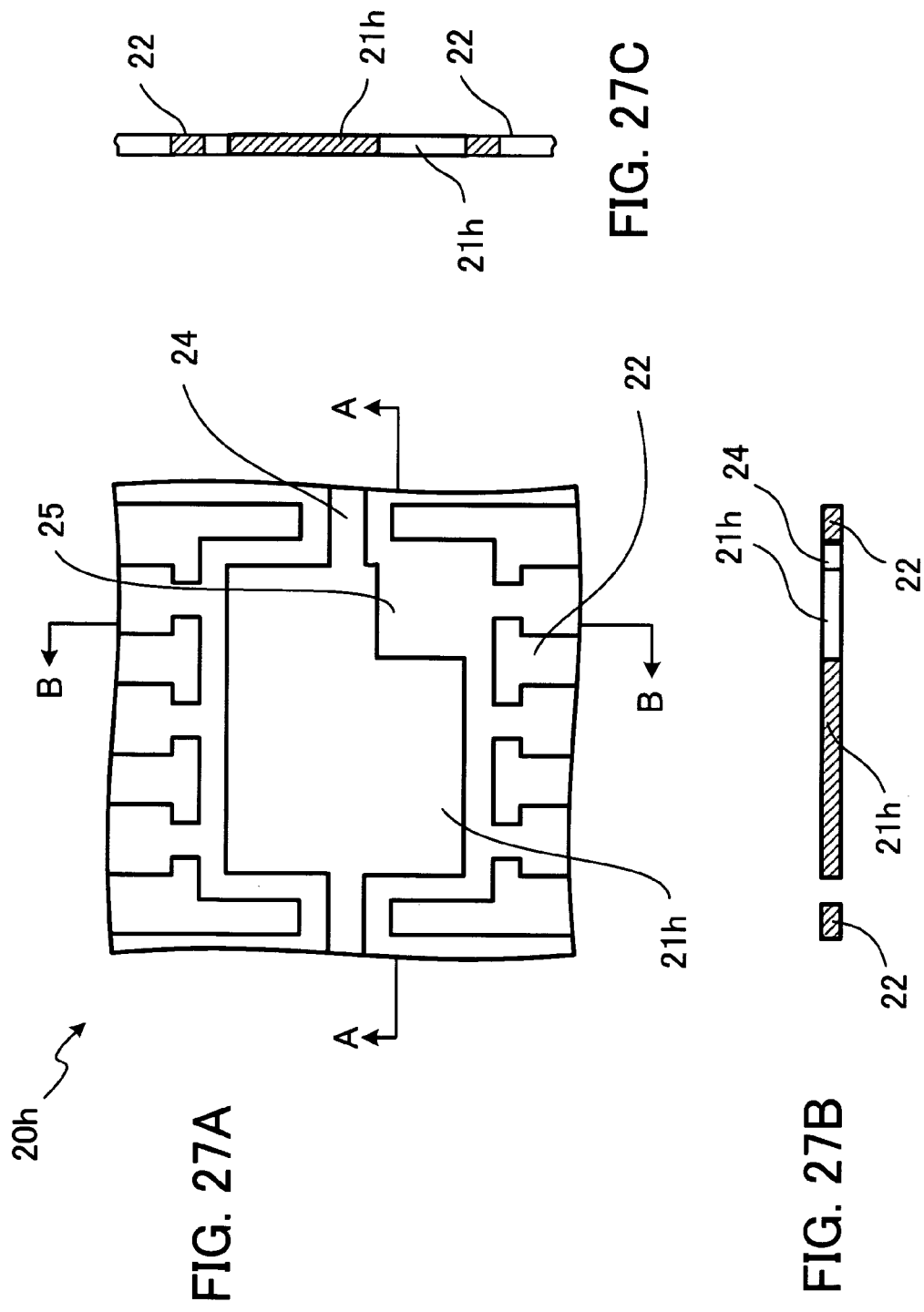

SEMICONDUCTOR DEVICE SEALED WITH ELECTRICAL INSULATION SEALING MEMBER

CROSS-REFERENCE TO RELATED APPLICATIONS

This application is based upon and claims the benefits of priority from the prior Japanese Patent Application No. 2006-015610, filed on Jan. 24, 2006, the entire contents of which are incorporated herein by reference.

BACKGROUND OF THE INVENTION

1. Field of the Invention

The present invention relates to a semiconductor device and a method for manufacturing the semiconductor device. More specifically, the present invention relates to a semiconductor device constituted by electrically connecting electronic components and passive components through bonding wires. The invention also pertains to a method for manufacturing the semiconductor device.

2. Description of the Related Art

In a semiconductor chip (semiconductor element) such as an LSI (Large Scale Integration), for example, capacitors are connected between a power supply circuit and a ground circuit in order to suppress a power supply bounce or GND (ground) bounce caused by simultaneous switching of circuits within the semiconductor chip. As a result, stable feeding can be performed. Such capacitors are referred to as a bypass capacitor.

Further, in order to cut high frequency noises entering through a power supply line, inductors are also connected in series with the power supply line. Such inductors are referred to as a power supply filter.

When thus housing passive elements such as bypass capacitors or power supply filters in a semiconductor device having mounted thereon semiconductor chips and connecting the elements to semiconductor chips, the following advantages can be obtained. That is, the bypass capacitors or the power supply filters can be disposed closer to the circuits within the semiconductor chips, so that operations of the semiconductor chips can be stabled and as a result, electrical characteristics can be improved. Further, passive elements such as bypass capacitors or power supply filters need not be separately mounted on a system board for mounting thereon a semiconductor device, so that the number of components on the system board can be reduced and as a result, miniaturization of this system can be attained.

In such a semiconductor device, there is known a configuration such that using, as a passive element to be built into the device, a passive component in the form of chip component, connection between the semiconductor chip and the passive component is performed by bonding wires.

By using the passive components in the form of chip components, there can be used, for example, common chip components such as chip capacitors or chip inductors of which the outside dimension is standardized, which are referred to as so-called 1005 components, 0603 components or 0402 components. Therefore, semiconductor devices can be manufactured at low cost. The 1005 components have an outside dimension of 1.0 mm×0.5 mm×0.5 mm, the 0603 components have an outside dimension of 0.6 mm×0.3 mm×0.3 mm, and the 0402 components have an outside dimension of 0.4 mm×0.2 mm×0.2 mm. Any component has a shape that electrode terminals are provided on each end in the longitudinal direction.

Herein, there is known a method for interconnecting a passive component and a semiconductor chip using bonding wires (see, e.g., Japanese Unexamined Patent Application Publication No. Hei 8-162607 (FIG. 2), Japanese Unexamined Patent Application Publication No. 2004-47811 (p 18, FIGS. 6 and 7)).

When using this method, an area of a conductive pattern part can be reduced and therefore, a semiconductor device can be miniaturized. Further, a semiconductor chip and a passive component are interconnected using bonding wires without through conductive patterns and therefore, operations of the semiconductor device can be more stabilized, so that electrical characteristics can be improved.

Such passive components in the form of chip components are generally mounted on an inner lead part of a lead frame or a conductive pattern part such as an electrode pad of a wiring substrate using solder or a conductive adhesive in many cases. In this case, a conductive pattern having an area in view of region where solder or a conductive adhesive is wetted and spread is required. Further, a bonding region for connecting between the conductive pattern and the semiconductor chip by bonding wires is required.

Herein, Japanese Unexamined Patent Application Publication No. Hei 8-162607 (FIG. 2) discloses the following configuration. That is, on a die pad of a lead frame, a semiconductor chip and a capacitor are mounted and fixed closely to each other. Further, interconnection among the semiconductor chip, the capacitor and the lead frame is performed by wires. Then, the whole device is sealed with mold resins. In this publication, a method for fixing the semiconductor chip and the capacitor is not described in detail.

On the other hand, Japanese Unexamined Patent Application Publication No. 2004-47811 (p 18, FIGS. 6 and 7) discloses the following configuration. That is, on a die pad (stage) of a lead frame, a semiconductor chip and a passive component are mounted side by side. Further, the semiconductor chip and the passive component are connected through bonding wires. On a portion for mounting the passive component in the die pad, a concave part is formed by etching to allow the whole passive component to be mounted within this concave part through an insulating tape.

By taking such a configuration, the passive component is mounted through the insulating tape. Therefore, electrode terminals provided on each end of the passive component are prevented from coming in contact with the die pad. Further, the passive component is disposed closer to circuits within the semiconductor chip. As a result, electrical characteristics of the semiconductor device can be improved as well as operations thereof can be stabilized. Further, on the die pad, the concave part is formed and the passive component is mounted to fit within the concave part, and therefore, the mounted height of the passive component can be reduced.

However, in these preceding examples, when mounting and fixing the passive component on the die pad, an insulating tape is used as an adhesive material. At this time, a step of preparing a tape processed to a predetermined size and adhering the tape to the concave part is required and therefore, a process is complicated.

A method of using an insulating paste adhesive in place of the insulating tape is also considered; however, this method has a high possibility of causing the following problems in producing semiconductor devices.

(1) In mounting a passive component on an insulating paste adhesive which is coated and supplied on a die pad using a dispenser, when a load imposed on such a passive component excessively increases, electrode terminals of the passive component and the die pad may be brought into contact with each other to cause a short circuit.

(2) On the contrary, when a load imposed on the passive component excessively decreases, the passive component may be obliquely mounted on the die pad. When performing wire bonding to electrode terminals of the passive component in this state, a wire edge may fail to be surely connected to the electrode terminal.

SUMMARY OF THE INVENTION

In view of the foregoing, it is an object of the present invention to provide a semiconductor device capable of preventing contact between electrode terminals and a die pad as well as capable of surely performing wire bonding to the electrode terminals.

Another object of the present invention is to provide a method for manufacturing the semiconductor device.

To accomplish the above objects, according to one aspect of the present invention, there is provided a semiconductor device sealed with an electrical insulation sealant. This semiconductor device comprises: a passive component having a columnar body part with insulation and a pair of electrode terminals provided on each axial end of the body part, a semiconductor element connected to at least one of the electrode terminals through a bonding wire, and a base substrate having a portion formed to have no contact with the electrode terminals, wherein each of the passive component and the semiconductor element is mounted through an adhesive layer and the body part is supported to be nearly parallel to a substrate surface.

According to another aspect of the present invention, there is provided a method for manufacturing a semiconductor device constituted by connecting through wire bonding a semiconductor element and a passive component having a columnar body part and a pair of electrode terminals provided on each axial end of the body part. This method comprises the steps of: forming a concave part on a base material to obtain a base substrate, supplying an adhesive member to the concave part, providing the passive component such that the body part is located on the base substrate through the adhesive member and each of the electrode terminals is located on a portion corresponding to the concave part through the adhesive member, applying a predetermined pressure on the passive component to temporarily adhere the passive component and the base substrate, and curing the adhesive member to finally adhere the passive component and the base substrate.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 4A, 4B and 4C each show a lead frame of a semiconductor device according to the first embodiment, FIG. 4A is a partial plan view showing a lead frame, FIG. 4B is a sectional view taken along a line A-A of the lead frame shown in FIG. 4A, and FIG. 4C is a sectional view taken along a line B-B of the lead frame shown in FIG. 4A.

FIGS. 7A, 7B and 7C each show a modification example of a lead frame of the semiconductor device according to the first embodiment, FIG. 7A is a plan view showing the lead frame of the semiconductor device, FIG. 7B is a sectional view taken along a line A-A of the lead frame shown in FIG. 7A, and FIG. 7C is a sectional view taken along a line B-B of the lead frame shown in FIG. 7A.

FIG. 12A is a plan view showing the lead frame of the semiconductor device, FIG. 12B is a sectional view taken along a line A-A of the lead frame shown in FIG. 12A, and FIG. 12C is a sectional view taken along a line B-B of the lead frame shown in FIG. 12A.

FIG. 14A is a plan view showing the lead frame of the semiconductor device, FIG. 14B is a sectional view taken along a line A-A of the lead frame shown in FIG. 14A, and FIG. 14C is a sectional view taken along a line B-B of the lead frame shown in FIG. 14A.

FIGS. 16A, 16B, 16C and 16D each show a lead frame of a semiconductor device according to a fifth embodiment, FIG. 16A is a plan view showing the lead frame of the semiconductor device, FIG. 16B is a sectional view taken along a line A-A of the lead frame shown in FIG. 16A, FIG. 16C is a sectional view taken along a line B-B of the lead frame shown in FIG. 16A, and FIG. 16D is a sectional view taken along a line C-C of the lead frame shown in FIG. 16A.

FIGS. 19A, 19B, 19C and 19D each show a lead frame of a semiconductor device according to a sixth embodiment, FIG. 19A is a plan view showing the lead frame of the semiconductor device, FIG. 19B is a sectional view taken along a line A-A of the lead frame shown in FIG. 19A, FIG. 19C is a sectional view taken along a line B-B of the lead frame shown in FIG. 19A, and FIG. 19D is a sectional view taken along a line C-C of the lead frame shown in FIG. 19A.

FIG. 22A is a plan view showing the lead frame of the semiconductor device, FIG. 22B is a sectional view taken along a line A-A of the lead frame shown in FIG. 22A, and FIG. 22C is a sectional view taken along a line B-B of the lead frame shown in FIG. 22A.

FIGS. 27A, 27B and 27C each show a lead frame of a semiconductor device shown in FIG. 26, FIG. 27A is a plan view showing the lead frame of the semiconductor device, FIG. 27B is a sectional view taken along a line A-A of the lead frame shown in FIG. 27A, and FIG. 27C is a sectional view taken along a line B-B of the lead frame shown in FIG. 27A.

DESCRIPTION OF THE PREFERRED EMBODIMENTS

Preferred embodiments of the present invention will be described in detail below with reference to the accompanying drawings.

Figure 1:
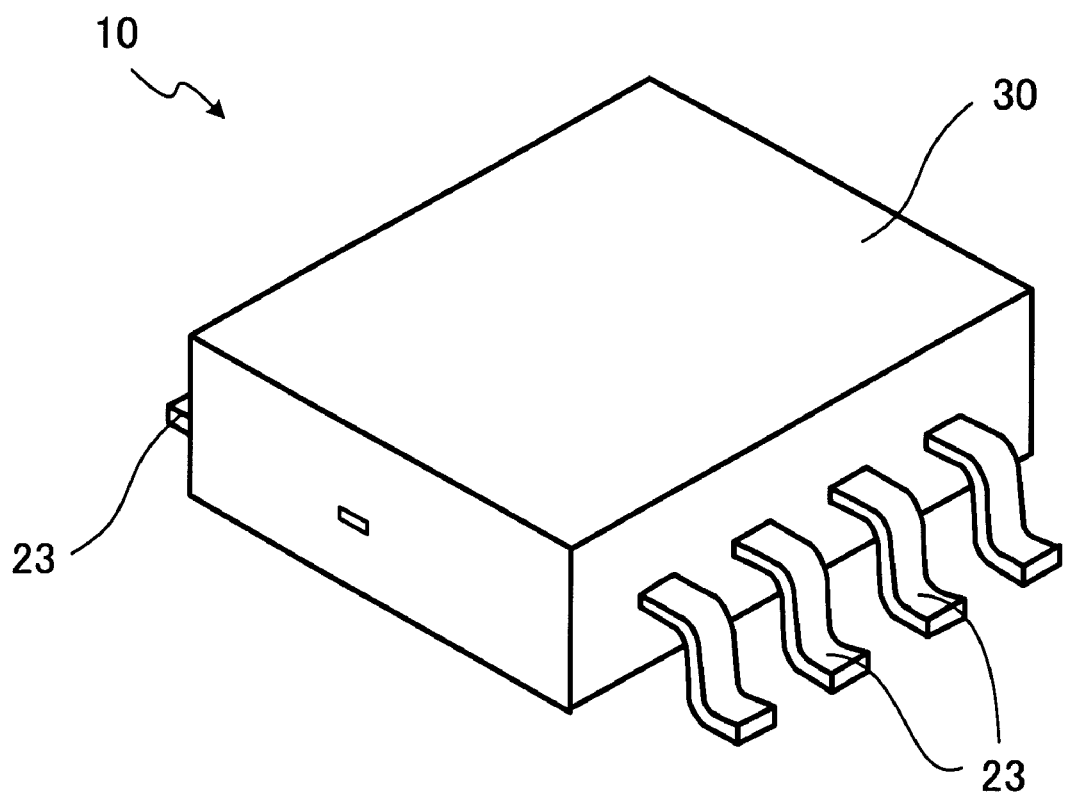
FIG. 1 is a perspective view showing a semiconductor device according to an embodiment.

FIG. 1 is a perspective view showing a semiconductor device according to an embodiment.

A semiconductor device 10 is an LSI package of an SOP (Small Outline Package) type. The whole device 10 is sealed with an electrical insulation sealing member, or sealant 30 after mounting the after-described semiconductor element on a lead frame. Further, four outer leads 23 electrically connected to the semiconductor element are provided on each side surface of the sealant 30. Examples of constituent materials for the sealant 30 include an epoxy resin.

Figure 2:
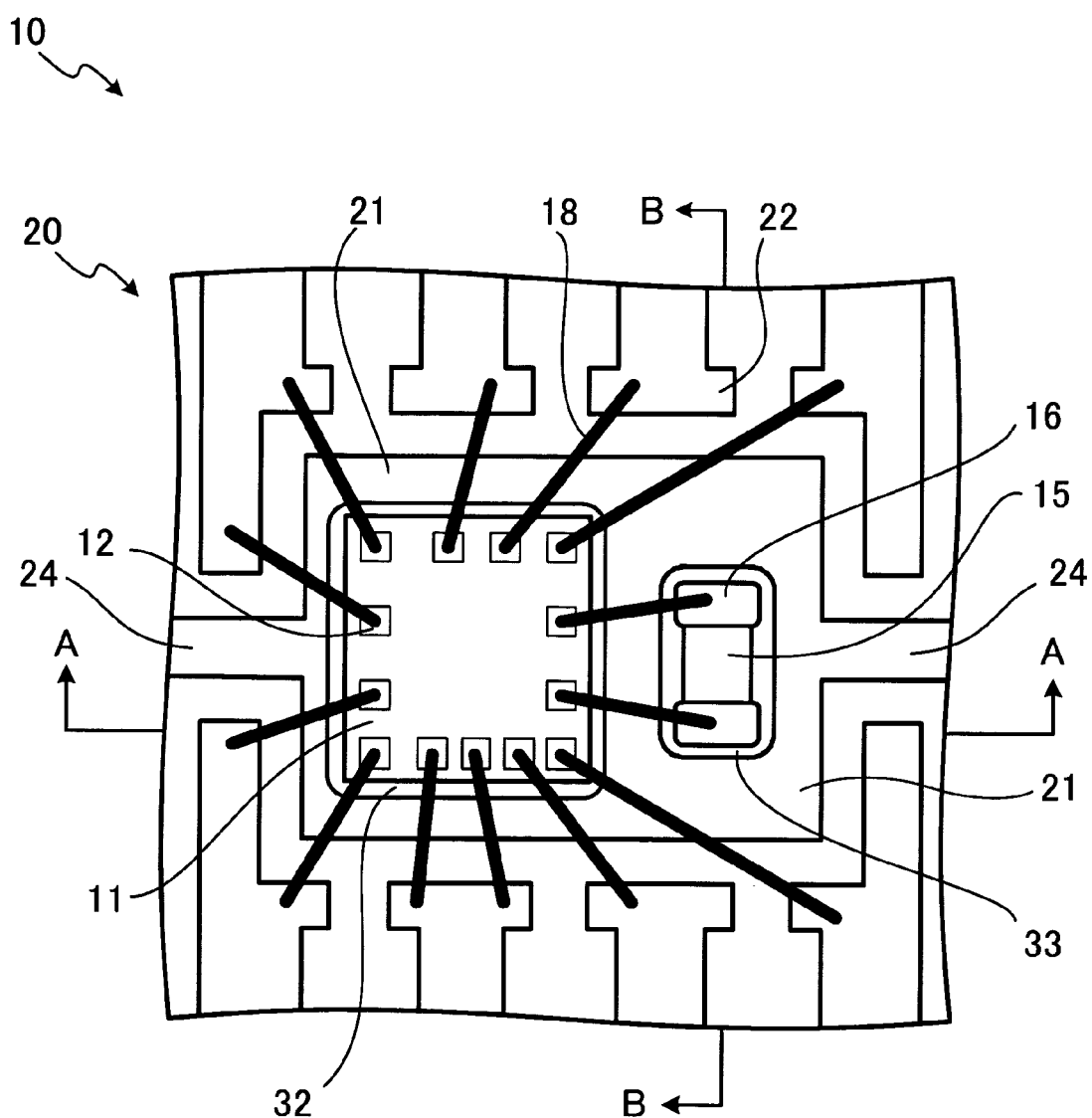
FIG. 2 is a plan view showing the inside of a semiconductor device according to a first embodiment.

FIG. 2 is a plan view showing the inside of a semiconductor device according to a first embodiment.

In FIG. 2, an upper side, a lower side and a right side are hereinafter referred to as "upper", "lower" and "right", respectively.

The semiconductor device 10 has a semiconductor element 11, a passive component 15, a plurality of wires (bonding wires) 18, and a lead frame 20 including a die pad (base substrate) 21, a plurality of inner leads 22 and outer leads 23 which are provided around the die pad 21 and a pair of supporting parts 24, 24.

Constituent materials for the lead frame 20 are not particularly limited. Examples thereof include conductors such as an iron (Fe)-nickel alloy, copper (Cu) and a copper alloy. Further, a plate thickness of the lead frame 20 is, for example, about 0.125 mm, 0.15 mm, 0.2 mm or 0.25 mm.

Each of the inner leads 22 is electrically connected to each of the outer leads 23.

The semiconductor element 11 is disposed on the die pad 21 through a layered adhesive 32. Further, the semiconductor element 11 has a plurality of electrode pads 12 provided on a surface thereof.

Constituent materials for the adhesive 32 are not particularly limited. Examples thereof include a thermosetting resin and thermoplastic resin made of an epoxy resin or a polyimide resin. Further, these resins may contain conductive particles such as silver (Ag), nickel (Ni) and carbon (C).

Each of the electrode pads 12 is electrically connected to each of the plural inner leads 22 through the wire 18.

Figure 3:
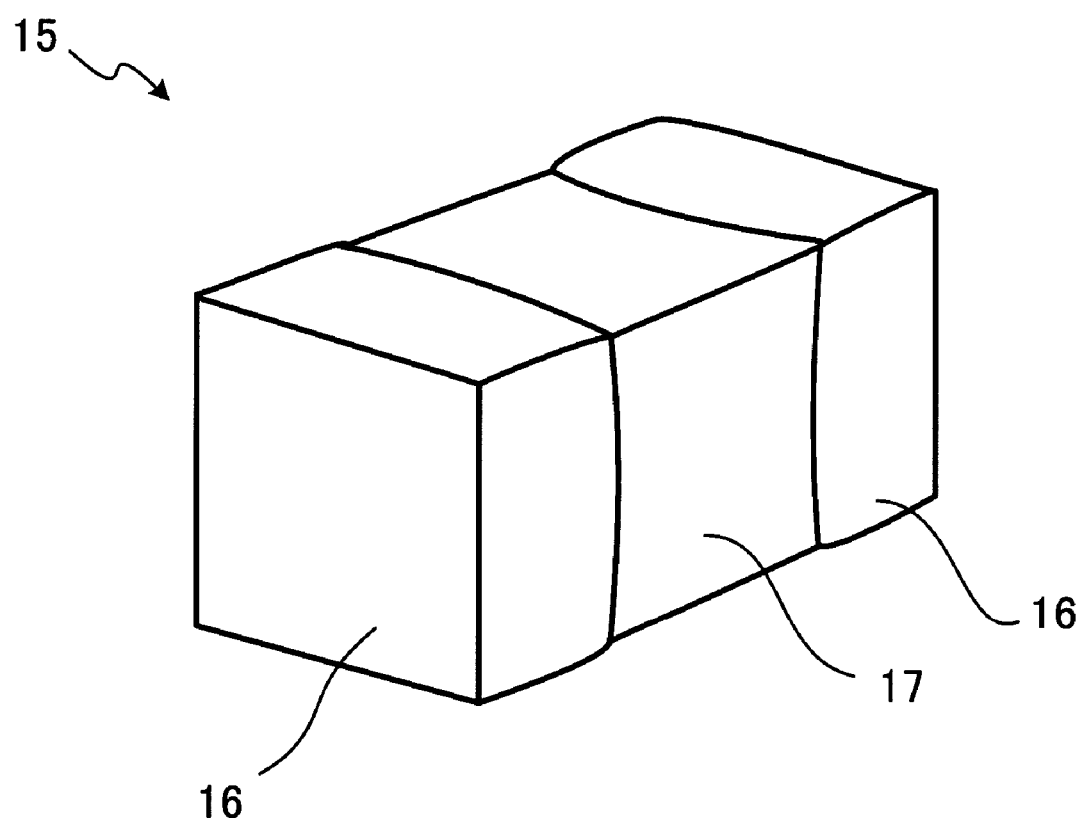
FIG. 3 is a perspective view showing a passive component.

FIG. 3 is a perspective view showing a passive component.

As shown in FIG. 3, the passive component 15 is disposed near the semiconductor element 11 (on the right side in FIG. 2). The passive component 15 is disposed on the die pad 21 through an insulation adhesive (adhesion layer) 33. Constituent materials for the adhesive 33 are not particularly limited. The adhesive 33 is composed of, for example, a thermosetting resin made of an epoxy resin or a polyimide resin.

The passive component 15 is formed to be columnar (rectangular parallelepiped) and has an insulation element part (body part) 17 provided in the center and electrode terminals 16, 16 provided on each end of the element part 17. Further, the passive component 15 is connected to the electrode pad 12 on the semiconductor element 11 through the electrode terminals 16, 16 and the wires 18, 18.

The passive component 15 is not particularly limited. Examples thereof include a capacitor serving as a bypass capacitor, an inductor serving as a noise filter, and a resistor.

The passive component 15 and the inner lead 22 may be electrically connected using the wire 18.

The wire 18 is composed of, for example, a metal such as gold or aluminum.

FIG. 4 each show the lead frame of the semiconductor device according to the first embodiment, FIG. 4A is a partial plan view showing the lead frame, FIG. 4B is a sectional view taken along a line A-A of the lead frame shown in FIG. 4A, and FIG. 4C is a sectional view taken along a line B-B of the lead frame shown in FIG. 4A.

As shown in these figures, concave parts 27, 27 with shapes (sizes) corresponding to those of the electrode terminals 16, 16 are provided on the portions corresponding to the electrode terminals 16, 16 on the die pad 21. A portion of the die pad 21 between these concave parts 27, 27 forms a high position part 28. A depth of the concave part 27 is formed in response to the shape of the electrode terminal 16 and is not particularly limited. The depth is, for example, about from 5 to 80 µm.

Figure 5:
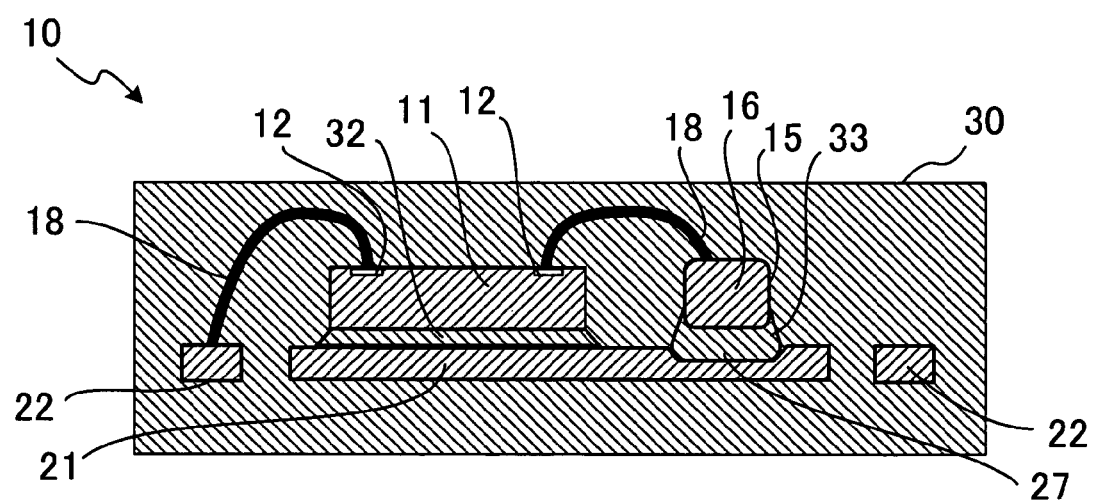
FIG. 5 is a sectional view taken along a line A-A of the semiconductor device shown in FIG. 2.
Figure 6:
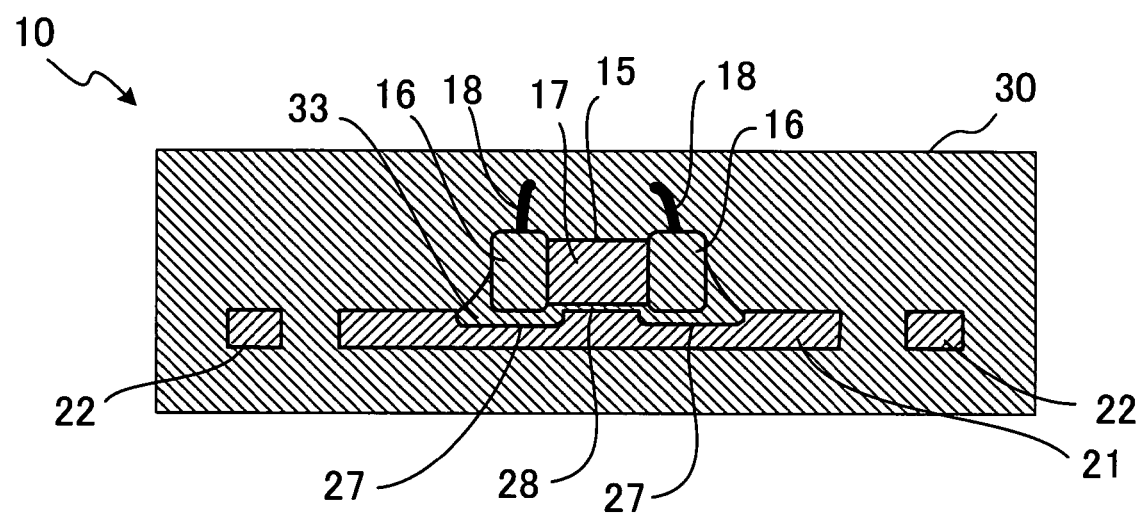
FIG. 6 is a sectional view taken along a line B-B of the semiconductor device shown in FIG. 2.

FIG. 5 is a sectional view taken along a line A-A of the semiconductor device shown in FIG. 2, and FIG. 6 is a sectional view taken along a line B-B of the semiconductor device shown in FIG. 2.

As shown in FIG. 6, the passive component 15 is formed such that a vertical length (hereinafter, referred to as a height) in FIG. 6 of each of the electrode terminals 16, 16 is higher than a height of the element part 17. More specifically, each cross-sectional area of the electrode terminals 16, 16 is slightly larger than that of the element part 17. Therefore, an upper part and lower part of each of the electrode terminals 16, 16 are located to be slightly higher (to project from) than the element part 17.

Through the adhesive 33, the passive component 15 is fixed such that the element part 17 is located on the high position part 28 so as to be nearly parallel to a substrate surface. Further, a part (bottom part) of each of the electrode terminals 16, 16 is located in each space within the concave parts 27, 27. Thus, a predetermined space is formed between each of the electrode terminals 16, 16 and the die pad 21. Therefore, according to the semiconductor device 10, contact between the passive component 15 and the die pad 21 can be easily and surely prevented by simple constitution. Further, the semiconductor device 10 can be made smaller (thinner).

In the present embodiment, the concave parts 27, 27 are formed separately; however, the present invention is not limited thereto. The concave parts may be integrally formed. Modification examples of the semiconductor device 10 will be described below.

FIGS. 7 show a modification example of the lead frame of the semiconductor device according to the first embodiment, FIG. 7A is a plan view showing the lead frame of the semiconductor device, FIG. 7B is a sectional view taken along a line A-A of the lead frame shown in FIG. 7A, and FIG. 7C is a sectional view taken along a line B-B of the lead frame shown in FIG. 7A.

As shown in FIG. 7, the semiconductor device 10 may have the following configuration. That is, on the die pad 21, a ring-like concave part 27 is formed to surround the passive component 15 in a plan view. Further, the high position part 28 (convex part) of which the height is almost equivalent to a depth of the concave part 27 is formed within the concave part 27.

Next, the manufacturing method of the semiconductor device according to the present invention will be described by taking as an example a case of manufacturing the semiconductor device 10 shown in FIGS. 2 to 6.

Figure 8:
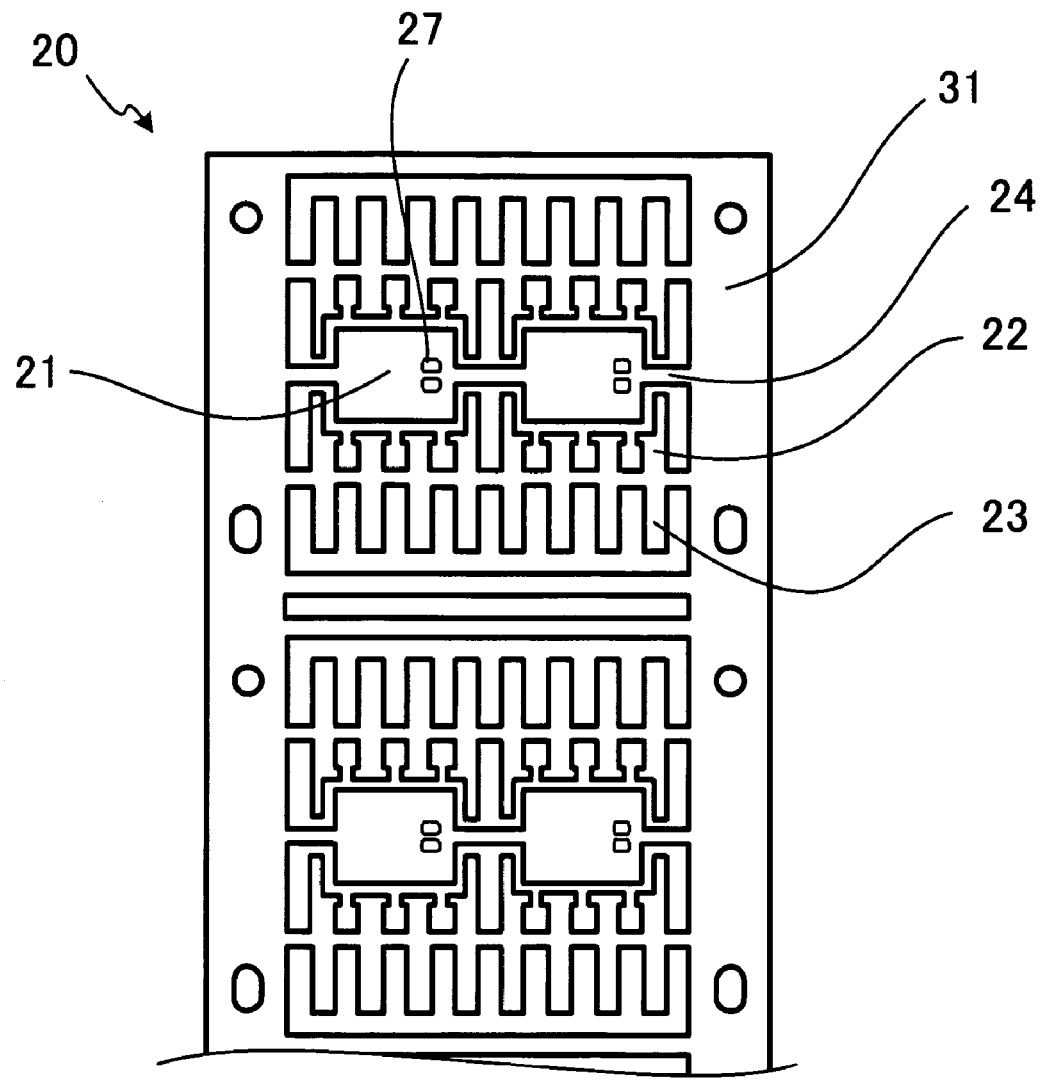
FIG. 8 is a sectional view showing a manufacturing method of the semiconductor device according to the first embodiment.
Figure 9:
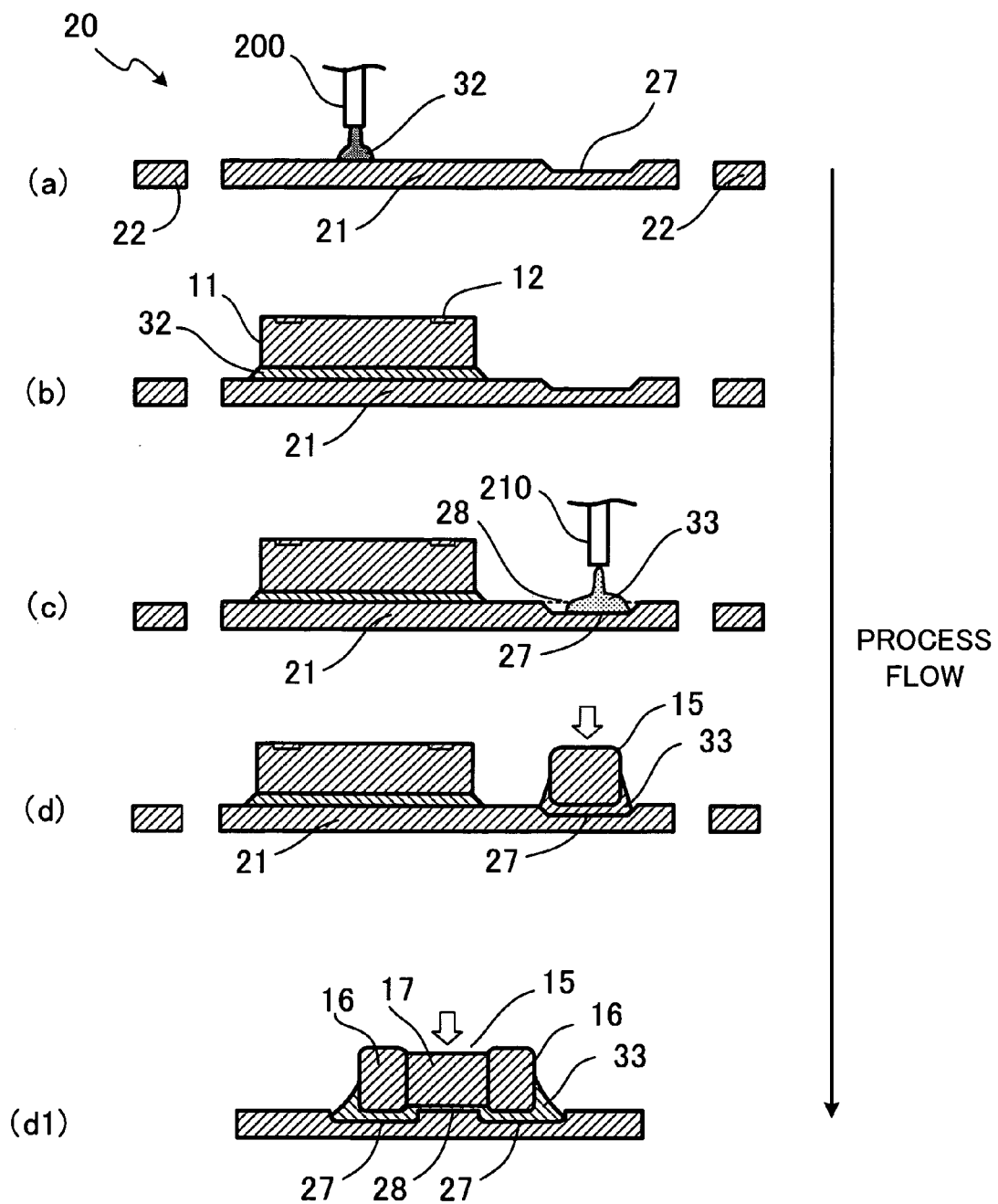
FIG. 9 is a sectional view showing a manufacturing method of the semiconductor device according to the first embodiment.
Figure 10:
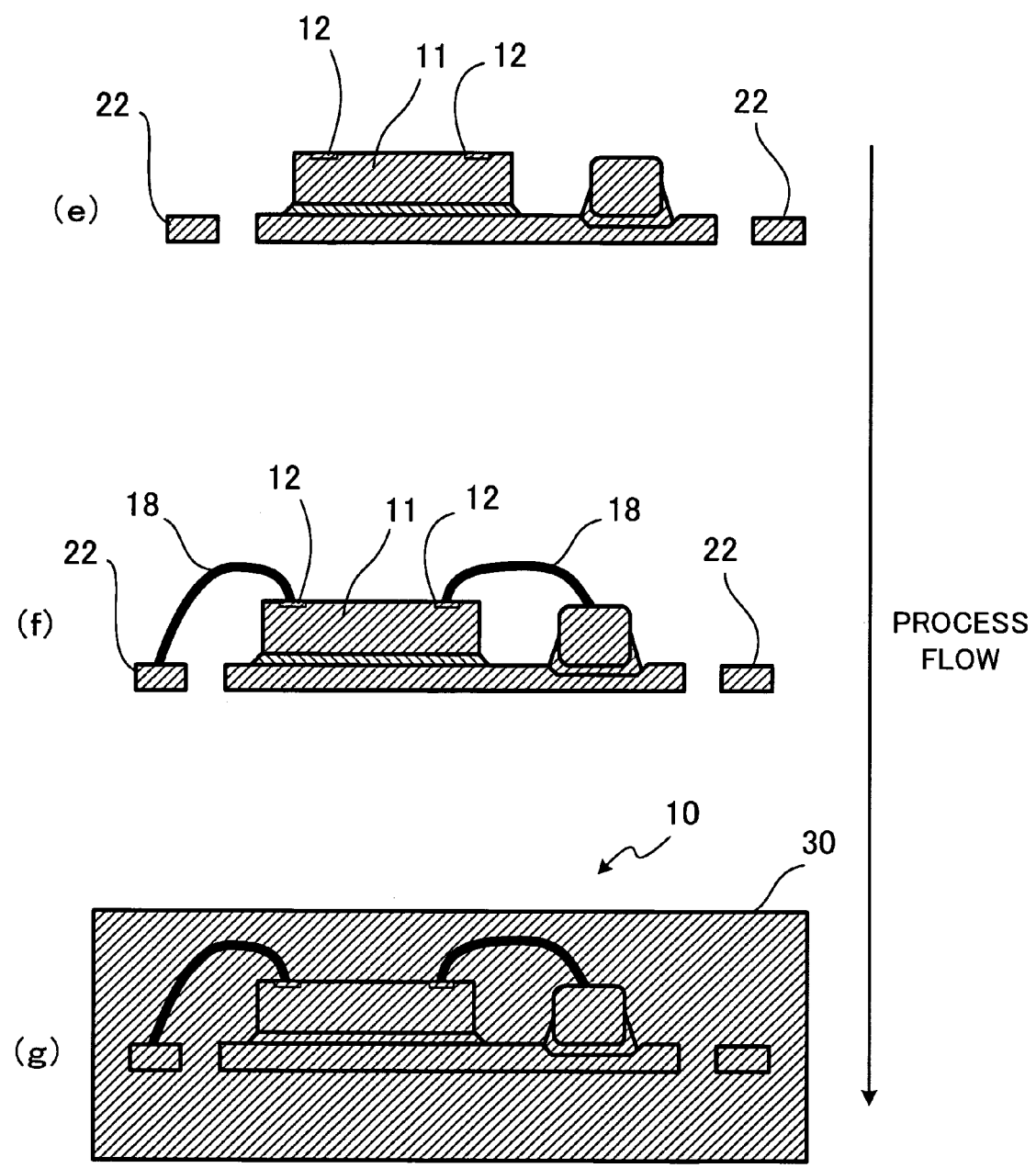
FIG. 10 is a sectional view showing a manufacturing method of the semiconductor device according to the first embodiment.

FIGS. 8 to 10 each are sectional views showing a manufacturing method of the semiconductor device according to the first embodiment.

First, as shown in FIG. 8, there is prepared the lead frame 20 having the die pad 21 on which the concave parts 27, 27 with shapes corresponding to those of the electrode terminals 16, 16 of the passive component 15 are formed by processing a thin metal plate, the inner leads 22, the outer leads 23, the supporting parts 24 and the outer frame 31 (peripheral frame portion).

A method for manufacturing the concave parts 27, 27 is not particularly limited. Examples thereof include a method for chemically manufacturing the concave parts using etching (half etching) and a method for manufacturing the concave parts using die pressing and shaping by stamping/die or using mechanical processing such as cutting tool grinding.

Next, as shown in FIG. 9A, the adhesive 32 is ejected from a nozzle 200 into a portion for disposing the semiconductor element 11 in the die pad 21.

Next, as shown in FIG. 9B, the die pad 21 and the semiconductor element 11 are connected (fixed) through the adhesive 32.

Next, as shown in FIG. 9C, the adhesive 33 is ejected from the nozzle 210 to the concave parts 27, 27 and the high position part 28.

Next, as shown in FIGS. 9D and 9D1, the passive component 15 is disposed such that the element part 17 is located on the high position part 28 and the electrode terminals 16, 16 are respectively located on the concave components 27, 27. Then, the passive component 15 and the die pad 21 are temporarily adhered through an uncured adhesive 33. At this time, a predetermined pressure is applied on the passive component 15 in a direction indicated by arrows in the figures and thereby, the passive component 15 is stabilized. Herein, the pressure applied on the passive component 15 is appropriately adjusted in response to the viscosity of the adhesive 33. The pressure is, for example, about 0.5 to 4 N.

Next, as shown in FIG. 10E, the adhesive 33 is cured by being heated at a predetermined temperature and thereby, the passive component 15 is fixed on the die pad 21 through the adhesive 33.

Next, as shown in FIG. 10F, the semiconductor element 11 and each of the electrode terminals 16, 16 are connected using the wire 18.

Next, as shown in FIG. 10G, the whole device is sealed with the sealant 30.

Next, shaping process of outer leads (not shown) is performed.

Thus, the semiconductor device 10 is completed.

According to the manufacturing method of the semiconductor device 10, the concave parts 27, 27 are provided on portions corresponding to the electrode terminals 16, 16 of the passive component 15 as well as the element part 17 is supported by the high position part 28 so as to be nearly parallel to the die pad 21, so that the passive component 15 can be disposed without inclining to the die pad 21. Therefore, wire bonding to the passive component 15 can be easily and surely performed. Further, in mounting the passive component 15 on the uncured adhesive 33 applied on the die pad 21, even if a load imposed on the passive component 15 excessively increases, the electrode terminal 16 can be prevented from coming in contact with the die pad 21 because a predetermined space is formed between the electrode terminal 16 and the die pad 21. As a result, a short circuit between the electrode terminal 16 and the die pad 21 can be prevented by a simple process.

In the above-described manufacturing method of the semiconductor device 10, the adhesive 33 is applied after adhering the die pad 21 and the semiconductor device 11; however, the die pad 21 and the semiconductor element 11 may be adhered after applying the adhesive 33 on the die pad 21. Further, a paste adhesive is used as the adhesive 32; however, the present invention is not limited thereto and a film-like adhesive may be used. For example, the film-like adhesive 32 may be previously attached on a lower surface of the semiconductor element 11.

Next, a second embodiment of a semiconductor device will be described.

Figure 11:
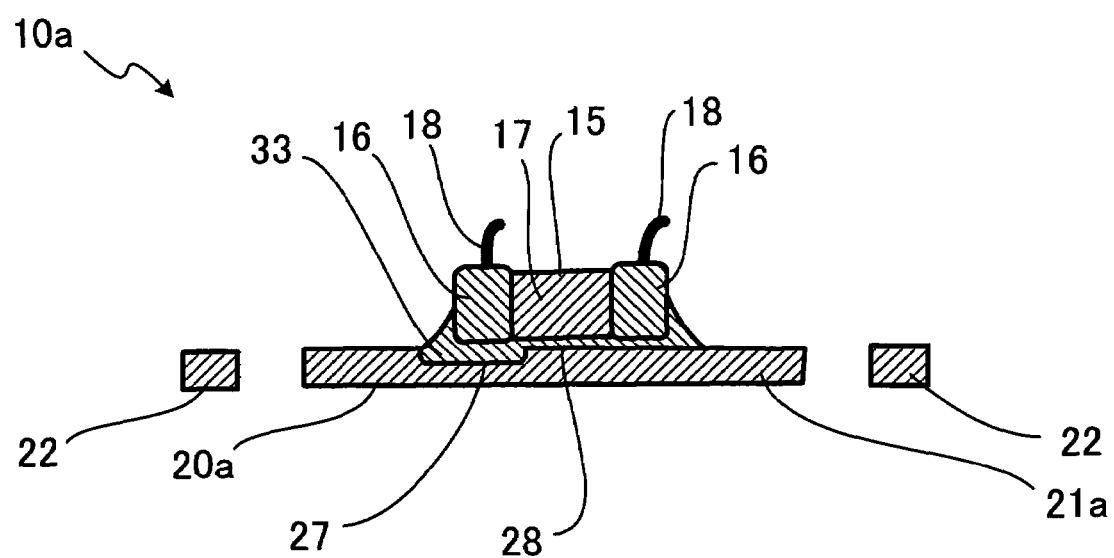
FIG. 11 is a sectional view showing a semiconductor device according to a second embodiment.

FIG. 11 is a sectional view showing a semiconductor device according to the second embodiment.

In the following figures, illustration of the sealant 30 is omitted to facilitate viewing of the figures.

The semiconductor device according to the second embodiment will be described below by focusing attention on the difference from the above-described first embodiment, and an explanation of the same matters as in the first embodiment will be omitted.

A configuration of a lead frame 20a (die pad 21a) in a semiconductor device 10a is different from that of the lead frame 20 (die pad 21) according to the first embodiment.

In a die pad 21a, the concave part 27 is provided only on a portion corresponding to the electrode terminal 16 (any one of the electrode terminals 16, 16) on the left side in FIG. 11.

Further, the portion corresponding to the right side (other) electrode terminal 16 in the die pad 21a is connected to ground potential. Therefore, in a case where the right side electrode terminal 16 is connected to ground potential, even if the right side electrode terminal 16 comes in contact with the die pad 21a, the short circuit between the right side electrode terminal 16 and the left side electrode terminal 16 can be prevented because the die pad 21a and the left side electrode terminal 16 are separated by the concave part 27. As a result, operational functions of the passive component 15 can be prevented from being impaired.

According to the semiconductor device 10a of the second embodiment, the same effect as that in the semiconductor device 10 of the first embodiment is obtained.

Next, a third embodiment of a semiconductor device will be described.

Figure 12:
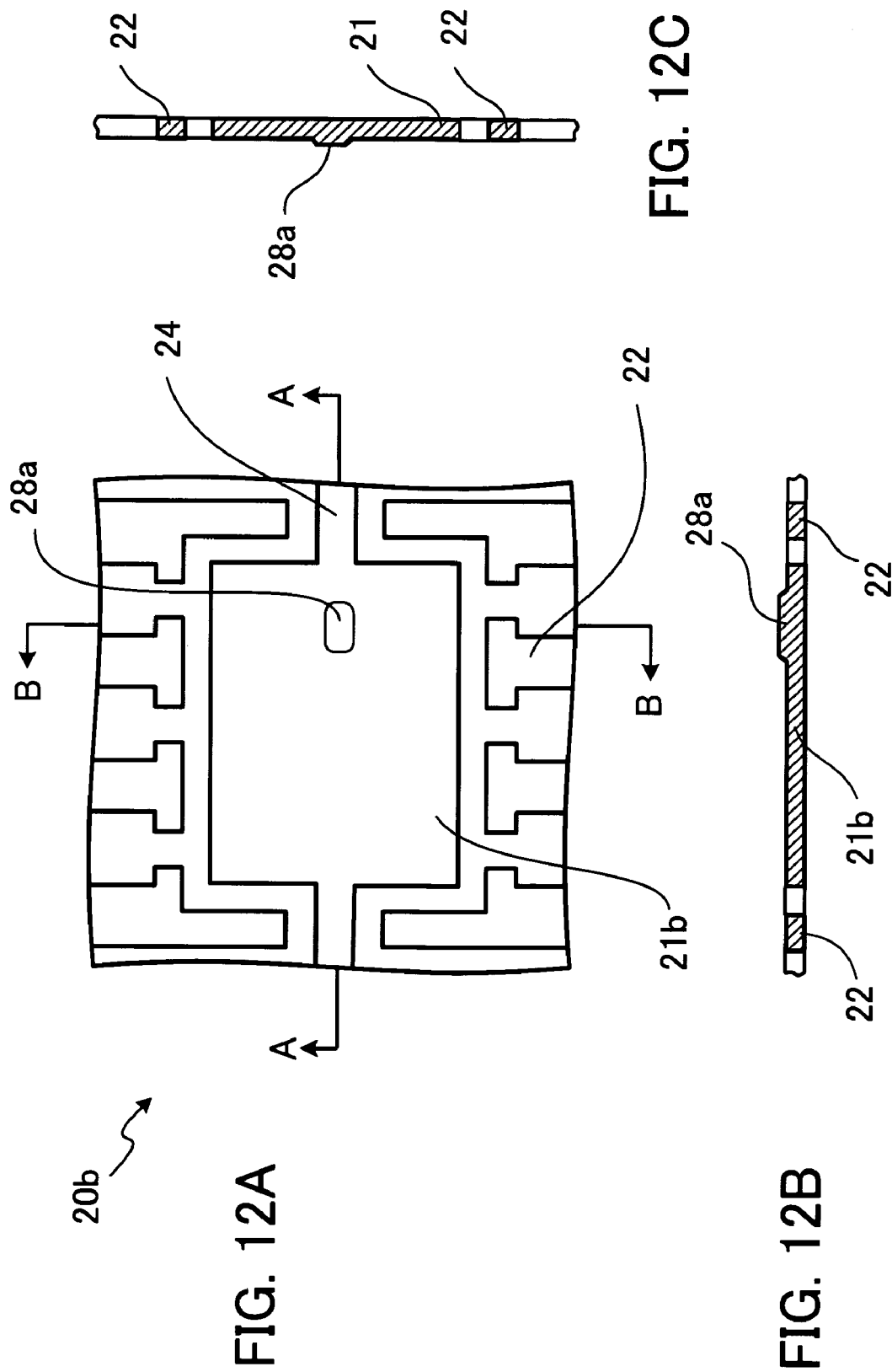
FIGS. 12A, 12B and 12C each show a lead frame of a semiconductor device according to a third embodiment.

FIGS. 12 each show a lead frame of a semiconductor device according to the third embodiment, FIG. 12A is a plan view showing the lead frame of the semiconductor device, FIG. 12B is a sectional view taken along a line A-A of the lead frame shown in FIG. 12A, and FIG. 12C is a sectional view taken along a line B-B of the lead frame shown in FIG. 12A.

The semiconductor device according to the third embodiment will be described below by focusing attention on the difference from the above-described first embodiment, and an explanation of the same matters as in the first embodiment will be omitted.

A configuration of a lead frame 20b (die pad 21b) in a semiconductor device 10b is different from that of the lead frame 20 (die pad 21) according to the first embodiment.

In the die pad 21b, a high position part 28a higher than the other portions of the die pad 21b is provided on the portion corresponding to the element part 17. The high position part 28a can be formed, for example, by etching.

Figure 13:
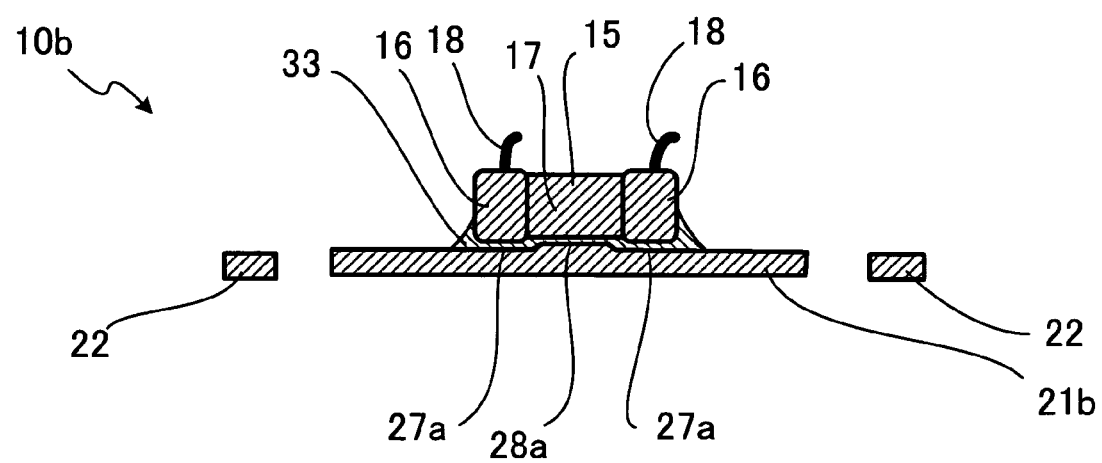
FIG. 13 is a sectional view showing the semiconductor device according to the third embodiment.

FIG. 13 is a sectional view showing a semiconductor device according to the third embodiment.

As shown in FIG. 13, the element part 17 is supported by the high position part 28a through the adhesive 33 to thereby form a predetermined space between each of the electrode terminals 16, 16 and each of the portions 27a, 27a each corresponding to the electrode terminals 16, 16 in the die pad 21b.

According to the semiconductor device 10b of the third embodiment, the same effect as that in the semiconductor device 10 of the first embodiment is obtained.

Next, a fourth embodiment of a semiconductor device will be described.

Figure 14:
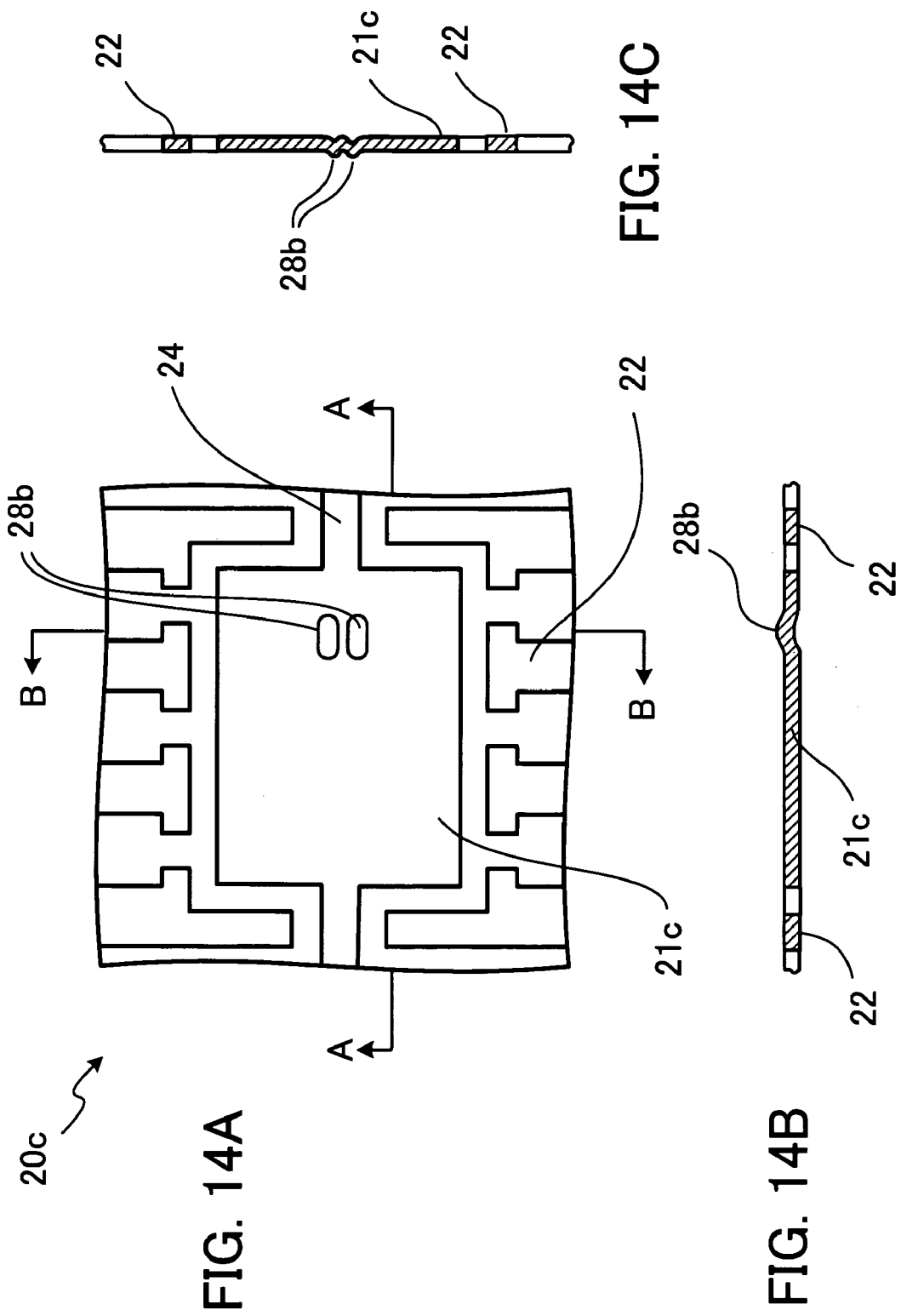
FIGS. 14A, 14B and 14C each show a lead frame of a semiconductor device according to a fourth embodiment.

FIG. 14 each show a lead frame of a semiconductor device according to the fourth embodiment, FIG. 14A is a plan view showing the lead frame of the semiconductor device, FIG. 14B is a sectional view taken along a line A-A of the lead frame shown in FIG. 14A, and FIG. 14C is a sectional view taken along a line B-B of the lead frame shown in FIG. 14A.

The semiconductor device according to the fourth embodiment will be described below by focusing attention on the difference from the above-described third embodiment, and an explanation of the same matters as in the third embodiment will be omitted.

A configuration of a lead frame 20c (die pad 21c) in a semiconductor device 10c is different from that of the lead frame 20b (die pad 21b) according to the third embodiment.

In the die pad 21c, a plurality of (two in the present embodiment) high position parts (convex parts) 28b higher than the other portions of the die pad 21 are provided on the portion corresponding to the element part 17.

Figure 15:
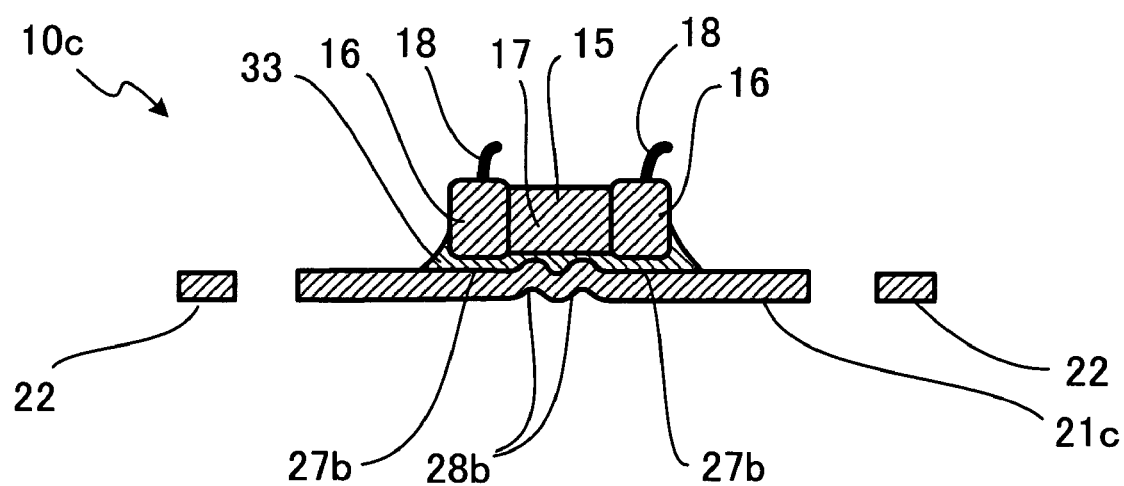
FIG. 15 is a sectional view showing the semiconductor device according to the fourth embodiment.

FIG. 15 is a sectional view showing a semiconductor device according to the fourth embodiment.

The high position part 28b can be formed, for example, by punching of the die pad 21c from the lower side in FIG. 15.

As shown in FIG. 15, the element part 17 is supported by the high position parts 28b, 28b through the adhesive 33 to thereby form a predetermined space between each of the electrode terminals 16, 16 and each of the portions 27b, 27b each corresponding to the electrode terminals 16, 16 in the die pad 21c.

According to the semiconductor device 10c of the fourth embodiment, the same effect as that in the semiconductor device 10b of the third embodiment is obtained. Further, according to the semiconductor device 10c of the fourth embodiment, the passive component 15 can be more stably supported by the high position parts 28b, 28b as well as wire bonding to the passive component 15 can be easily and surely performed also during the manufacturing process.

Next, a fifth embodiment of a semiconductor device will be described.

FIG. 16 each show a lead frame of a semiconductor device according to the fifth embodiment, FIG. 16A is a plan view showing the lead frame of the semiconductor device, FIG. 16B is a sectional view taken along a line A-A of the lead frame shown in FIG. 16A, FIG. 16C is a sectional view taken along a line B-B of the lead frame shown in FIG. 16A, and FIG. 16D is a sectional view taken along a line C-C of the lead frame shown in FIG. 16A.

The semiconductor device according to the fifth embodiment will be described below by focusing attention on the difference from the above-described first embodiment, and an explanation of the same matters as in the first embodiment will be omitted.

A configuration of a lead frame 20d (die pad 21d) in a semiconductor device 10d is different from that of the lead frame 20 (die pad 21) according to the first embodiment.

In a die pad 21d, concave parts 27c, 27c are provided on each portion corresponding to the electrode terminals 16, 16. Further, a high position part 28c which is higher than a concave part 27c and which is lower than the other portions of the die pad 21 (lower than the depth of the concave part 27c) is provided on the portion corresponding to the element part 17. Ends of the high position part 28C in the horizontal direction in FIG. 16A each form guide parts 29, 29.

The high position part 28c can be formed, for example, by punching.

Figure 17:
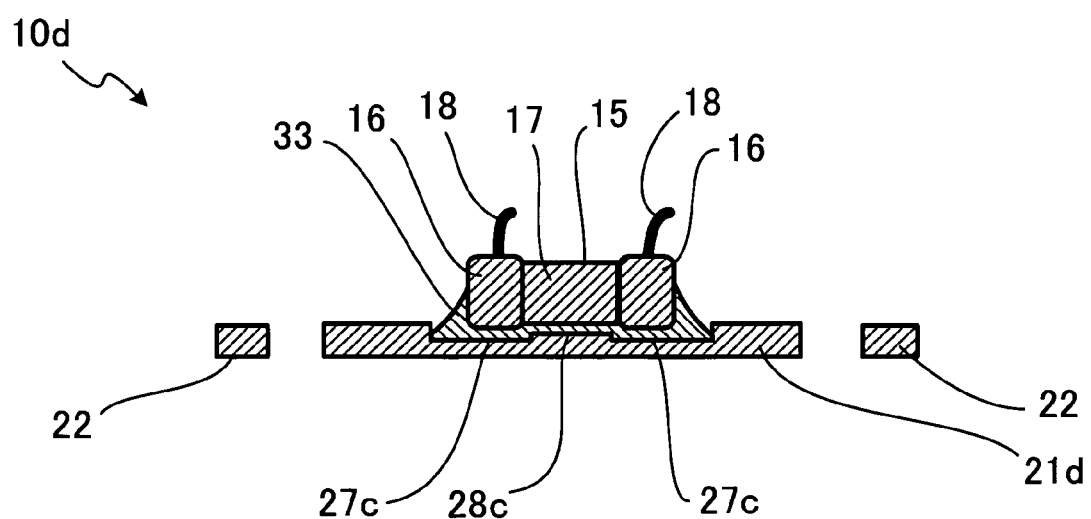
FIG. 17 is a sectional view showing the semiconductor device according to the fifth embodiment.
Figure 18:
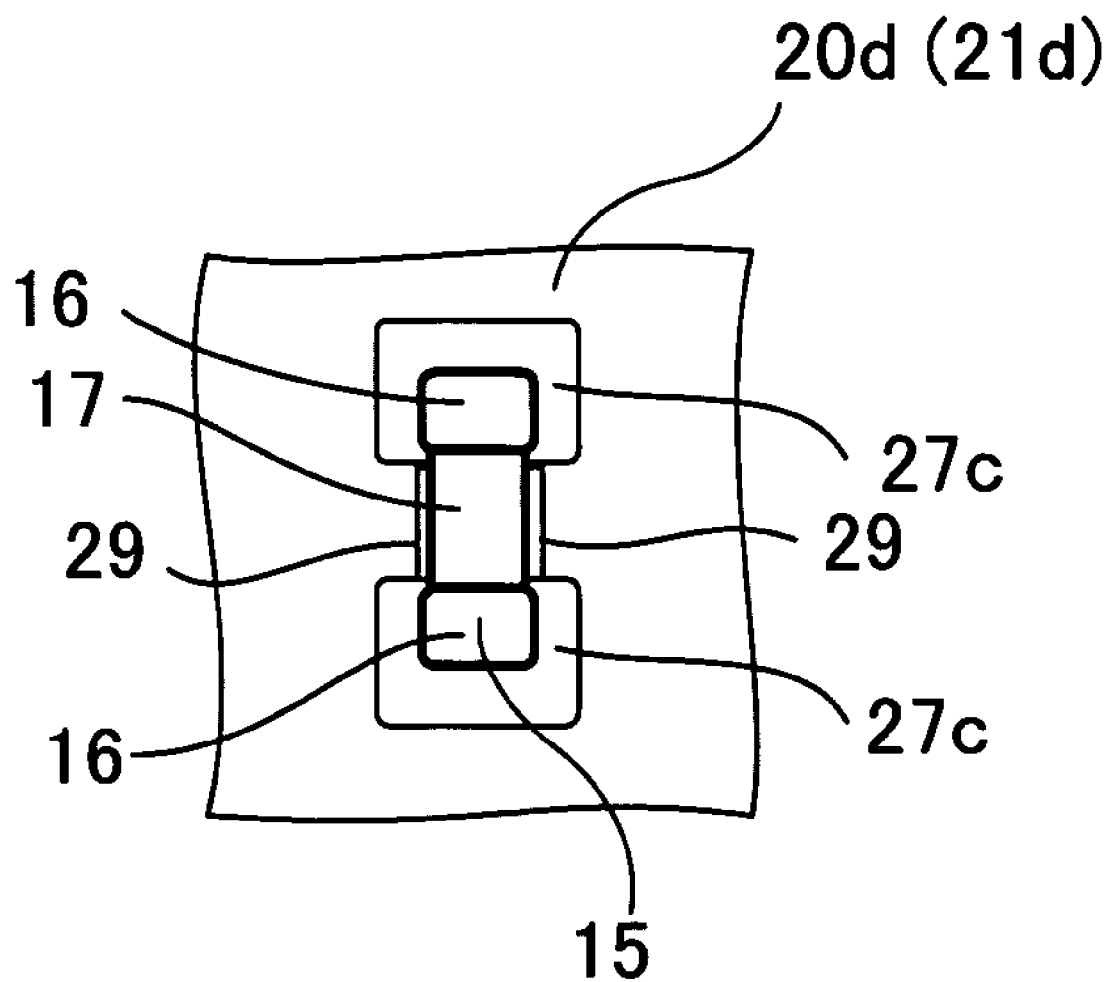
FIG. 18 is a plan view illustrating a configuration of a passive component of the semiconductor device according to the fifth embodiment.

FIG. 17 is a sectional view showing a semiconductor device according to the fifth embodiment, and FIG. 18 is a plan view illustrating a configuration of a passive component of the semiconductor device according to the fifth embodiment.

As shown in FIG. 17, the element part 17 is supported by the high position part 28C through the adhesive 33 to thereby form a space between each of the electrode terminals 16, 16 and each of the concave parts 27c, 27c. Further, as shown in FIG. 18, the element part 17 is sandwiched by the guide parts 29, 29 to thereby restrict movement in the horizontal direction of the passive component 15.

According to the semiconductor device 10d of the fifth embodiment, the same effect as that in the semiconductor device 10 of the first embodiment is obtained. Further, according to the semiconductor device 10d of the fifth embodiment, positioning of the passive component 15 is easily performed, so that the productivity during the manufacturing process and the manufacturing yield can be improved.

Next, a sixth embodiment of a semiconductor device will be described.

FIG. 19 show a lead frame of a semiconductor device according to the sixth embodiment, FIG. 19A is a plan view showing the lead frame of the semiconductor device, FIG. 19B is a sectional view taken along a line A-A of the lead frame shown in FIG. 19A, FIG. 19C is a sectional view taken along a line B-B of the lead frame shown in FIG. 19A, and FIG. 19D is a sectional view taken along a line C-C of the lead frame shown in FIG. 19A.

A semiconductor device 10e according to the sixth embodiment will be described below by focusing attention on the difference from the above-described first embodiment, and an explanation of the same matters as in the first embodiment will be omitted.

A configuration of a lead frame 20e (die pad 21e) in the semiconductor device 10e is different from that of the lead frame 20 (die pad 21) according to the first embodiment.

In a die pad 21e, guide parts 29a, 29a for sandwiching the element part 17 from the horizontal direction in FIG. 19 are formed near the high position part 28.

Figure 20:
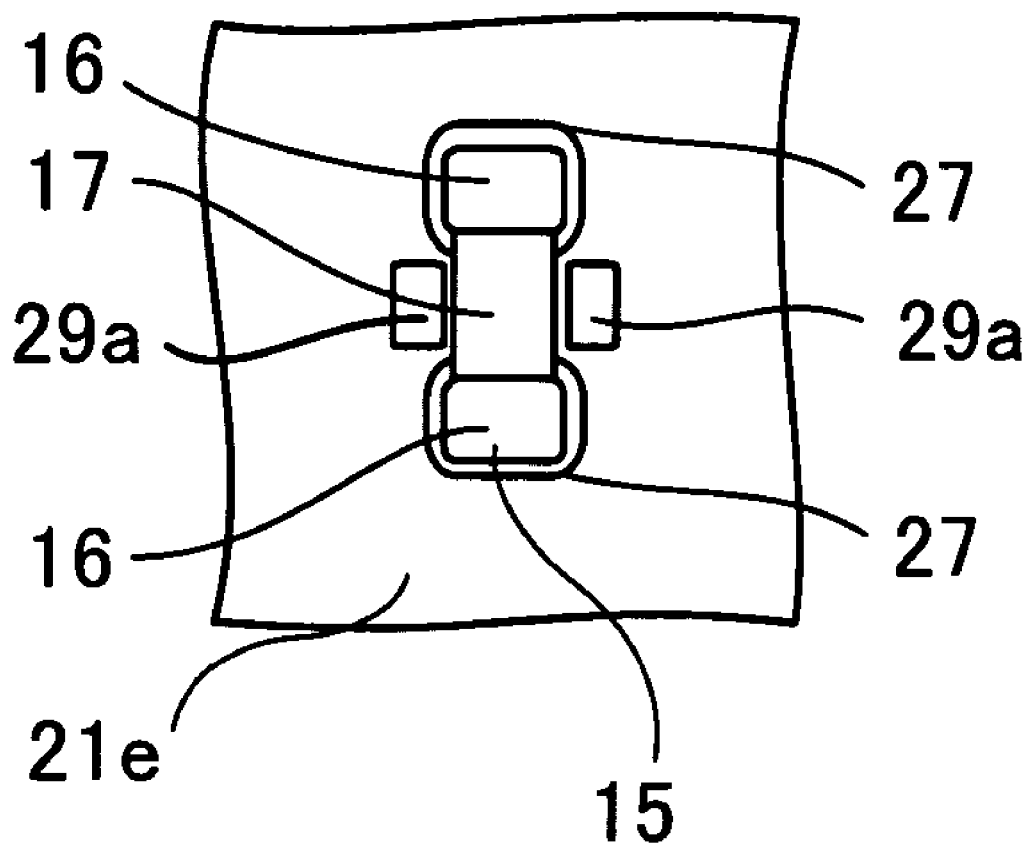
FIG. 20 is a plan view illustrating a configuration of a passive component of the semiconductor device according to the sixth embodiment.

FIG. 20 is a plan view illustrating a configuration of a passive component of the semiconductor device 10e according to the sixth embodiment.

As shown in FIG. 20, the element part 17 is supported by the high position part 28 through the adhesive 33 and is located between the guide parts 29a, 29a. Further, the element part 17 is sandwiched by the guide parts 29a, 29a to thereby restrict movement in the horizontal direction in FIG. 20 of the passive component 15.

According to the semiconductor device 10e of the sixth embodiment, the same effect as that in the semiconductor device 10 of the first embodiment is obtained. Further, according to the semiconductor device 10e of the sixth embodiment, positioning of the passive component 15 is easily performed, so that the productivity during the manufacturing process and the manufacturing yield can be improved.

In a semiconductor device constituted by mounting and fixing a semiconductor element on a die pad through a conductive adhesive to stabilize operations of a semiconductor device as well as to improve electrical characteristics of the device, a conductive adhesive made of an epoxy resin containing silver particles as a binder is widely used due to handiness in view of workability during the manufacturing process and availability of a measure of adhesion force.

However, the conductive adhesive contains a number of conductive particles in order to secure electrical conductivity. Therefore, the adhesive generally has a low adhesion force as compared with an insulation adhesive containing no conductive particles in many cases. Accordingly, in a semiconductor device constituted by connecting and mounting a semiconductor chip on a die pad using the conductive adhesive, when thermal stress is imposed on the semiconductor device or when the semiconductor device is placed under a high-humidity environment, peeling may occur in an interface between the conductive adhesive and the semiconductor chip, or in an interface between the conductive adhesive and the die pad. Particularly, when mounting a semiconductor device on a system board by reflow soldering, solder which contains no lead (Pb), such as tin (Sn)-silver (Ag) solder or tin-silver-copper (Cu) solder has been recently used at the request of environmental responsiveness. As a result, a temperature in mounting a semiconductor device more increases as compared with a case of mounting the device using conventional solder which contains lead, such as tin-lead solder. Therefore, a high reliability semiconductor device durable to this temperature is desired.

A next described semiconductor device according to a seventh embodiment is a device based on such a point.

Figure 21:
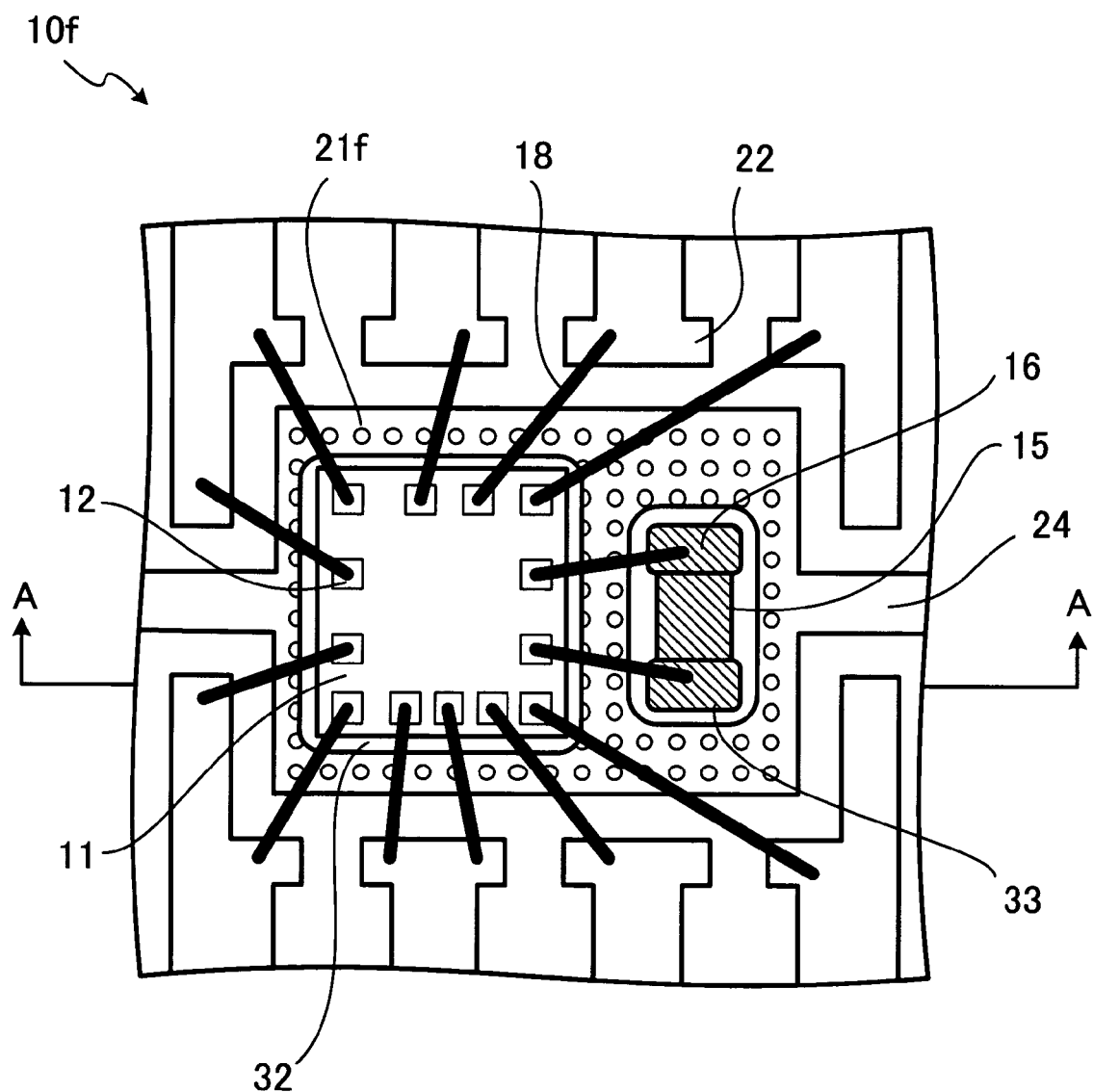
FIG. 21 is a plan view showing the inside of a semiconductor device according to a seventh embodiment.
Figure 22:
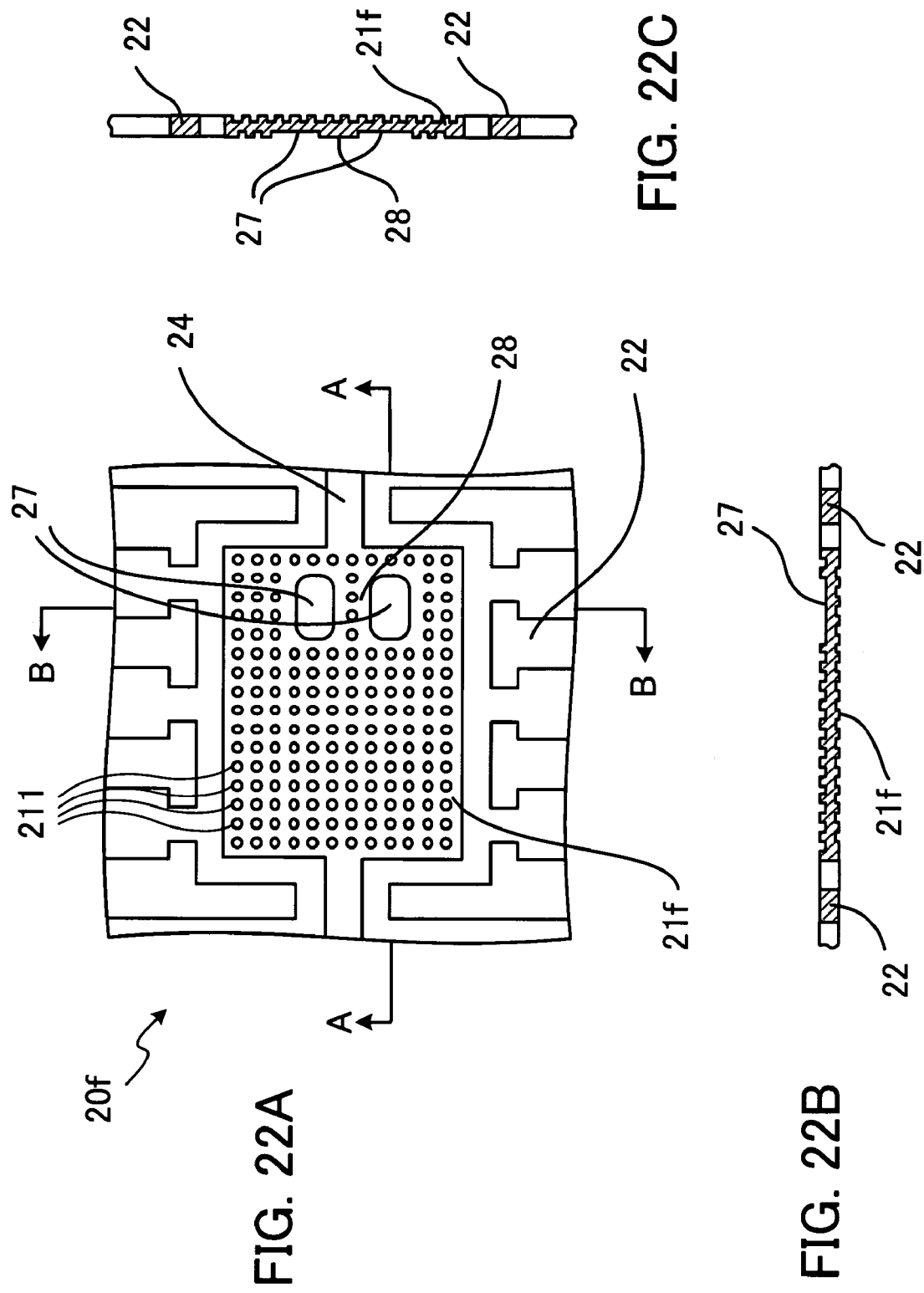
FIGS. 22A, 22B and 22C each show a lead frame of the semiconductor device shown in FIG. 21.

FIG. 21 is a plan view showing the inside of the semiconductor device according to the seventh embodiment. FIG. 22 each show a lead frame of the semiconductor device shown in FIG. 21, FIG. 22A is a plan view showing the lead frame of the semiconductor device, FIG. 22B is a sectional view taken along a line A-A of the lead frame shown in FIG. 22A, and FIG. 22C is a sectional view taken along a line B-B of the lead frame shown in FIG. 22A.

A semiconductor device 10f according to the seventh embodiment will be described below by focusing attention on the difference from the above-described first embodiment, and an explanation of the same matters as in the first embodiment will be omitted.

A configuration of a lead frame 20f (die pad 21f) in a semiconductor device 10f shown in FIG. 21 is different from that of the lead frame 20 (die pad 21) according to the first embodiment.

As shown in FIGS. 21 and 22, a plurality of concave parts (stepped parts) 211 each having a predetermined depth (almost the same depth as that of the concave part 27 in the present embodiment) are formed in a matrix shape on almost the whole surface of the die pad 21f other than the concave parts 27 of the lead frame 20f. The concave parts 211 are formed also on a lower surface (a surface opposite to a surface having the concave parts 27) of the die pad 21f. The concave parts 211 can be formed, for example, by etching.

When the concave parts 211 are thus disposed regularly, concave and convex parts are alternately formed on the surface of the die pad 21f as shown in FIGS. 22B and 22C. Further, the semiconductor element 11 is disposed on the concave and convex parts through the adhesive 32.

According to the semiconductor device 10f of the seventh embodiment, the same effect as that in the semiconductor device 10 of the first embodiment is obtained. Further, according to the semiconductor device 10f of the seventh embodiment, the adhesive strength between the semiconductor element 11 and the adhesive 32 is improved due to the anchoring effect and thereby, the semiconductor element 11 and the die pad 21f are more rigidly fixed. Further, since the concave parts 211 are formed also on the lower surface of the die pad 21f, the adhesive strength between the sealant 30 and the die pad 21f are also improved.

Next, an eighth embodiment of a semiconductor device will be described.

Figure 23:
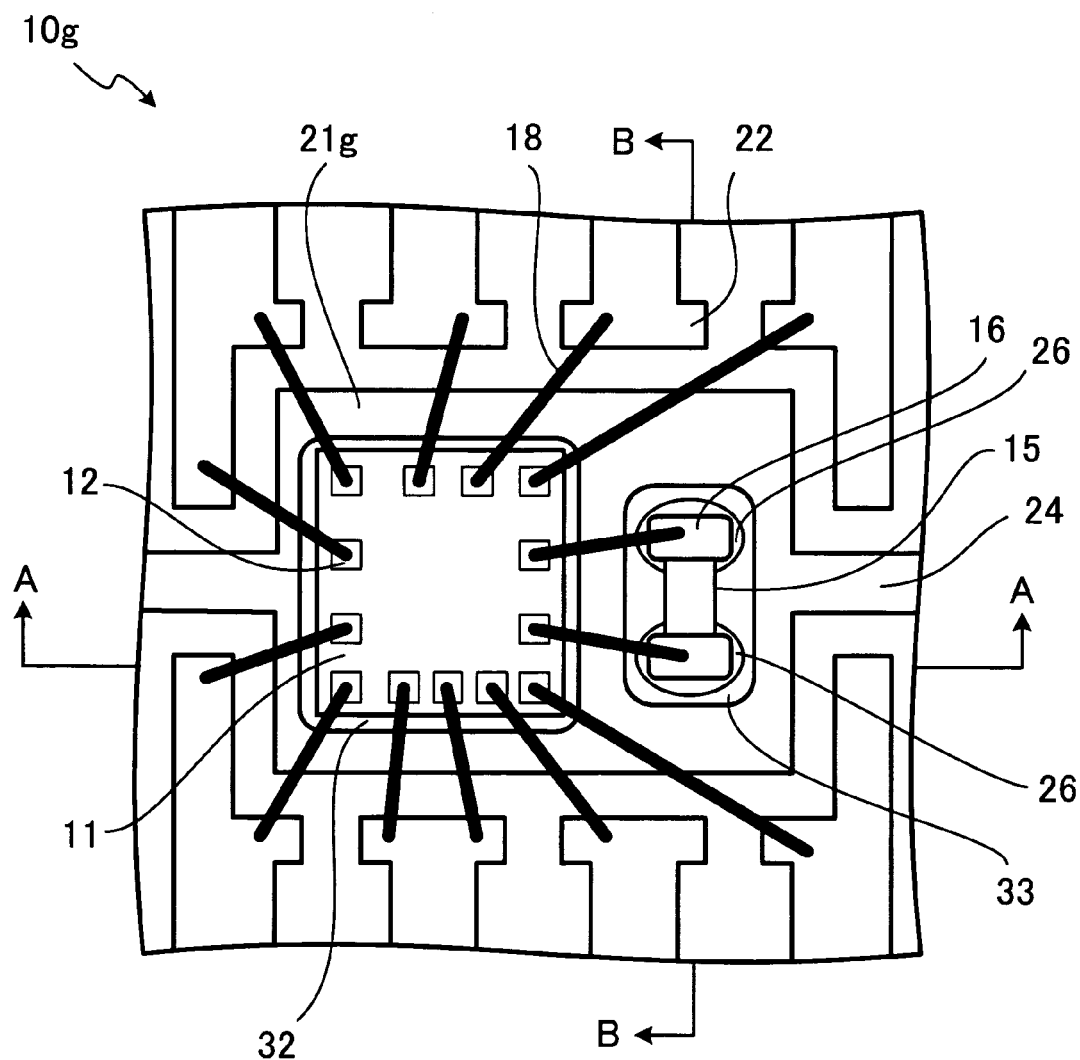
FIG. 23 is a plan view showing the inside of a semiconductor device according to an eighth embodiment.

FIG. 23 is a plan view showing the inside of a semiconductor device according to the eighth embodiment.

A semiconductor device 10g according to the eighth embodiment will be described below by focusing attention on the difference from the above-described first embodiment, and an explanation of the same matters as in the first embodiment will be omitted.

A configuration of a lead frame 20g (die pad 21g) in the semiconductor device 10g is different from that of the lead frame 20 (die pad 21) according to the first embodiment.

Openings 26, 26 are provided on each portion corresponding to the electrode terminals 16, 16 in the die pad 21g.

Figure 24:
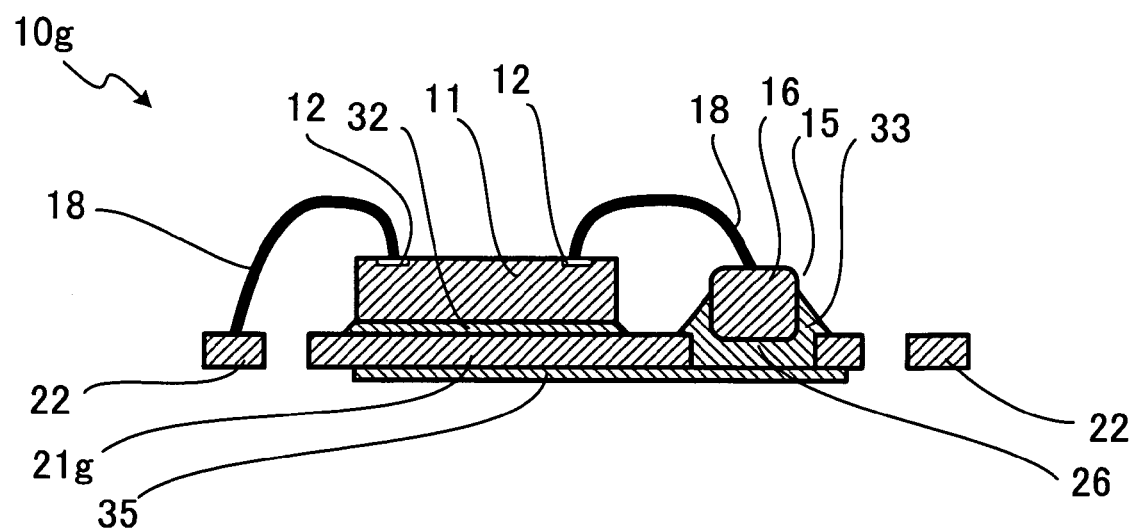
FIG. 24 is a sectional view taken along a line A-A of the semiconductor device in FIG. 23.
Figure 25:
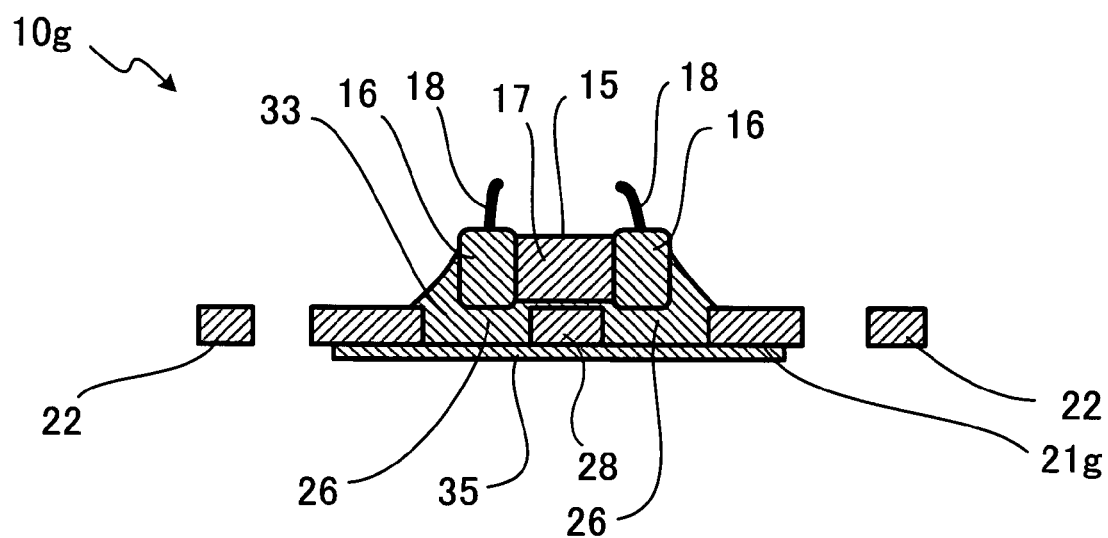
FIG. 25 is a sectional view taken along a line B-B of the semiconductor device in FIG. 23.

FIG. 24 is a sectional view taken along a line A-A of the semiconductor device in FIG. 23, and FIG. 25 is a sectional view taken along a line B-B of the semiconductor device in FIG. 23.

To a lower surface of the die pad 21g, a resin film 35 is adhered so as to cover the openings 26, 26. Further, through the adhesive 33 applied on the film 35, the passive component 15 according to the present embodiment is fixed on the die pad 21g such that the element part 17 is located on the high position part 28.

Constituent materials for the film 35 are not particularly limited. Preferred examples thereof include resins such as polyimide. When manufacturing the semiconductor device 10g, the adhesive 33 may be applied after fixing the film 35 on the die pad 21g. Alternately, after temporarily adhering the film 35 to the die pad 21g, the adhesive 33 may be applied to fix the film 35 and the die pad 21g in the subsequent step of finally bonding the adhesive 33 and the passive component 15. Further, the film 35 and the die pad 21g may be fixed in the previous step of sealing the whole device with the sealant 30.

According to the semiconductor device 10g of the eighth embodiment, the same effect as that in the semiconductor device 10 of the first embodiment is obtained. Further, according to the semiconductor device 10g of the eighth embodiment, there is obtained the advantage that when both of the adhesive 33 and the film 35 are composed of resins, peeling in the interface hardly occurs.

Next, a ninth embodiment of a semiconductor device will be described.

Figure 26:
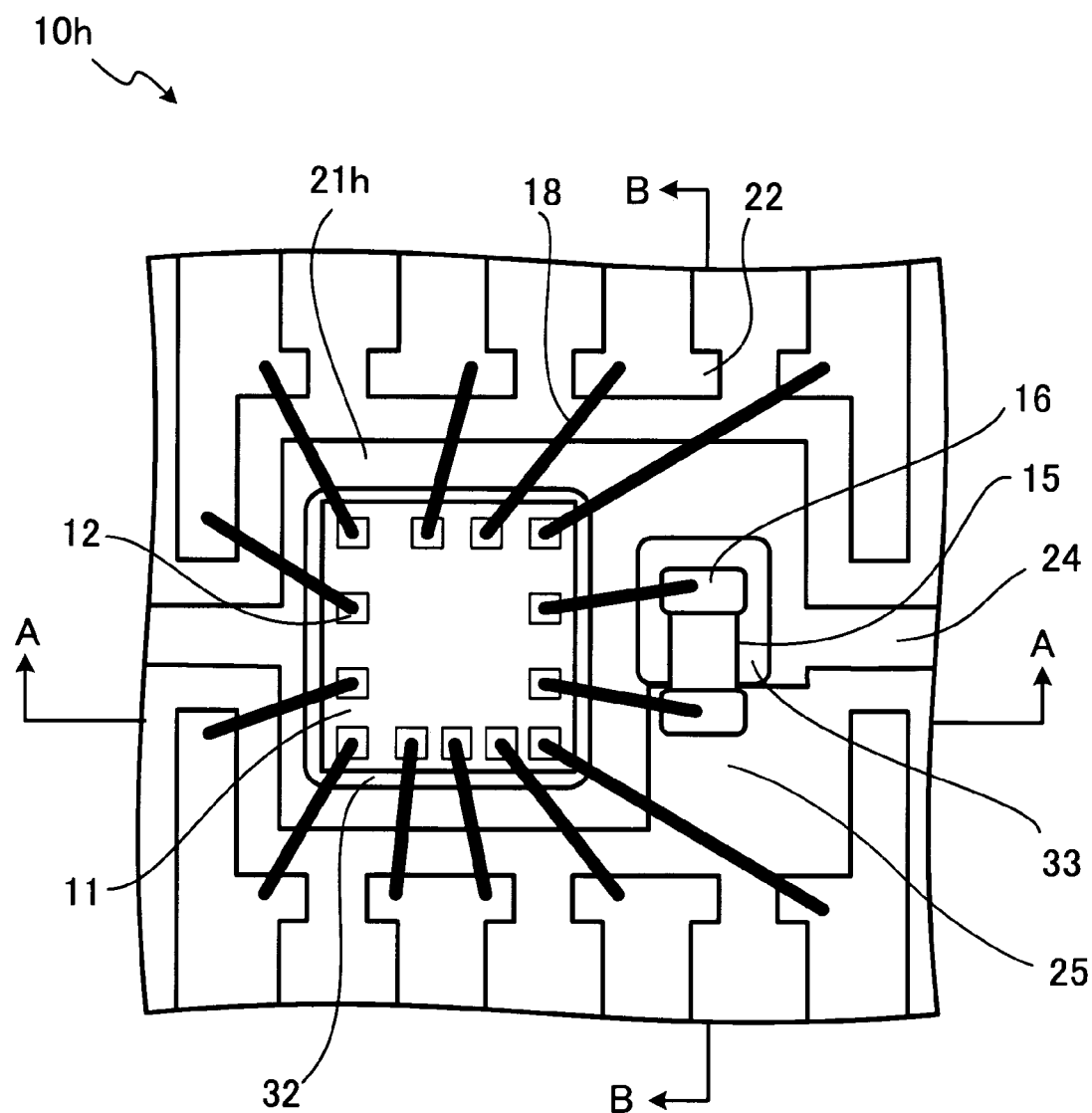
FIG. 26 is a plan view showing the inside of a semiconductor device according to a ninth embodiment.

FIG. 26 is a plan view showing the inside of a semiconductor device according to the ninth embodiment. FIG. 27 each show a lead frame of the semiconductor device shown in FIG. 26, FIG. 27A is a plan view showing a lead frame of the semiconductor device, FIG. 27B is a sectional view taken along a line A-A of the lead frame shown in FIG. 27A, and FIG. 27C is a sectional view taken along a line B-B of the lead frame shown in FIG. 27A.

A semiconductor device 10h according to the ninth embodiment will be described below by focusing attention on the difference from the above-described second embodiment, and an explanation of the same matters as in the second embodiment will be omitted.

A configuration of a lead frame 20h (die pad 21h) in the semiconductor device 10h is different from that of the lead frame 20a (die pad 21a) according to the second embodiment.

As shown in FIGS. 26 and 27, in the die pad 21h, a notched part 25 with a shape formed by notching the die pad 21 of the first embodiment is provided on the portion corresponding to the lower side electrode terminal 16 (one electrode terminal 16 of the passive component 15). Further, the lower side electrode terminal 16 projects from the die pad 21h to the notched part 25 in a plan view.

According to the semiconductor device 10h of the ninth embodiment, the same effect as that in the semiconductor device 10a of the second embodiment is obtained.

In the above, the semiconductor device and semiconductor device manufacturing method of the present invention are described with reference to the embodiments shown in the figures; however, the present invention is not limited thereto. A constituent of each part can be replaced by an arbitrary constituent having the same function. Further, other arbitrary constituents or steps may be added to the present invention.

Further, in the present invention, two or more arbitrary constituents (features) selected from the above-described respective embodiments may be combined.

In the above-described respective embodiments, an LSI package of SOP type is described; however, the present invention is not limited thereto. The present invention can be applied also to an LSI package of an SOJ (Small Out-line J-leaded Package) type or a QFP (Quad Flat Package) type. Further, the present invention can be applied not only to a lead frame type semiconductor device but also to the entire semiconductor device in which a die pad part for mounting (installing) a semiconductor chip and a passive component is composed of a conductor.

Further, in the above-described respective embodiments, the semiconductor element 11 is connected to the passive component 15 through the wire 18; however, the present invention is not limited thereto. Another semiconductor package or light emitting element may be connected to a passive component through wires.

Further, the present invention can be applied to various semiconductor devices having a die pad with electrical conductivity.

According to the present invention, the passive component is supported to be nearly parallel to the base substrate as well as the electrode terminals are prevented from coming in contact with the base substrate. Therefore, the contact between the electrode terminal and the base substrate can be prevented as well as the wire bonding to the passive component can be surely performed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device sealed with an electrical insulation sealing member, comprising:
   a passive component having a columnar body part with insulation and a pair of electrode terminals provided on each axial end of the body part;
   a semiconductor element connected to at least one of the electrode terminals through a bonding wire; and
   a base substrate having an electrical conductivity and having a portion formed to have no contact with the electrode terminals,
   wherein each of the passive component and the semiconductor element is mounted through an adhesive layer and the body part is supported to be nearly parallel to a substrate surface.

2. The semiconductor device according to claim 1, wherein a concave part is formed on a portion corresponding to the electrode terminal in the base substrate.

3. The semiconductor device according to claim 2, wherein a plurality of the concave parts are formed on portions corresponding to each of the electrode terminals.

4. The semiconductor device according to claim 2, wherein the concave part is formed on any one of the electrode terminals.

5. The semiconductor device according to claim 1, wherein a convex part is formed on a portion corresponding to the body part in the base substrate.

6. The semiconductor device according to claim 5, wherein a plurality of the convex parts are formed along a longitudinal direction of the body part.

7. The semiconductor device according to claim 1, wherein a concave part is formed on a portion corresponding to the passive component in the base substrate, and a convex part with a height lower than a depth of the concave part is formed on a portion corresponding to the body part within the concave part.

8. The semiconductor device according to claim 2, wherein a guide part for restricting movement to a direction almost perpendicular to a longitudinal direction of the passive component is provided.

9. The semiconductor device according to claim 1, wherein a plurality of concave and convex parts are formed over almost the whole surface of the base substrate.

10. The semiconductor device according to claim 9, wherein the plurality of concave and convex parts are regularly disposed.

11. The semiconductor device according to claim 9, wherein the plurality of concave and convex parts are formed also on a surface side opposite to a surface for mounting the semiconductor element in the base substrate.

12. The semiconductor device according to claim 1, wherein an opening is formed on a portion corresponding to the electrode terminal in the base substrate.

13. The semiconductor device according to claim 12, wherein a resin member formed to cover the opening is applied to a surface side opposite to a surface for mounting the semiconductor element in the base substrate.

14. The semiconductor device according to claim 1, wherein one of the electrode terminals of the passive component projects from the base substrate in a plan view.

* * * * *